US012810942B2

(12) United States Patent
Inuzuka et al.

(10) Patent No.: US 12,810,942 B2
(45) Date of Patent: Nov. 24, 2026

(54) SEMICONDUCTOR MEMORY DEVICE

(71) Applicant: Kioxia Corporation, Tokyo (JP)

(72) Inventors: Yuki Inuzuka, Yokohama Kanagawa (JP); Hidehiro Shiga, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 99 days.

(21) Appl. No.: 18/590,836

(22) Filed: Feb. 28, 2024

(65) Prior Publication Data

US 2024/0304257 A1 Sep. 12, 2024

(30) Foreign Application Priority Data

Mar. 10, 2023 (JP) ................................ 2023-037449

(51) Int. Cl.

| | |
|---|---|
| ***G11C 16/16*** | (2006.01) |
| ***G11C 16/04*** | (2006.01) |
| ***G11C 16/08*** | (2006.01) |
| ***H10B 41/10*** | (2023.01) |
| ***H10B 41/27*** | (2023.01) |
| ***H10B 41/35*** | (2023.01) |
| ***H10B 41/50*** | (2023.01) |

(Continued)

(52) U.S. Cl.

CPC .......... *G11C 16/16* (2013.01); *G11C 16/0483* (2013.01); *G11C 16/08* (2013.01); *H10B 41/10* (2023.02); *H10B 41/27* (2023.02); *H10B 41/35* (2023.02); *H10B 41/50* (2023.02); *H10B 43/10* (2023.02); *H10B 43/27* (2023.02); *H10B 43/35* (2023.02); *H10B 43/50* (2023.02); *G11C 2216/02* (2013.01)

(58) Field of Classification Search

CPC ..... G11C 16/16; G11C 16/0483; G11C 16/08; G11C 2216/02; G11C 16/10; H10B 41/10; H10B 41/27; H10B 41/35; H10B 41/50; H10B 43/10; H10B 43/27; H10B 43/35; H10B 43/50

See application file for complete search history.

(56) References Cited

U.S. PATENT DOCUMENTS

| | | | | |
|---|---|---|---|---|
| 2017/0271021 | A1 | 9/2017 | Futatsuyama et al. | |
| 2018/0277565 | A1 * | 9/2018 | Futatsuyama .......... | G11C 16/26 |

(Continued)

FOREIGN PATENT DOCUMENTS

| | | | |
|---|---|---|---|
| JP | 2017-168163 | A | 9/2017 |
| JP | 2018-164070 | A | 10/2018 |

*Primary Examiner* — Allison Bernstein
(74) *Attorney, Agent, or Firm* — Kim & Stewart LLP

(57) ABSTRACT

A semiconductor memory device includes first and second semiconductor pillars, a first string including first memory cells connected in series and a second string including second memory cells connected in series on opposite sides of the first semiconductor pillar, respectively, a third string including third memory cells connected in series and a fourth string including fourth memory cells connected in series, on opposite sides of the second semiconductor pillar, respectively, first word lines, second word lines, and a driver configured to supply different voltages to the first and second word lines during an erasing operation to erase data in the second and fourth memory cells. In the erasing operation, the driver supplies a first voltage higher than a reference voltage to the first word lines, and supplies the reference voltage to the second word lines.

9 Claims, 21 Drawing Sheets

(51) Int. Cl.

| | |
|---|---|
| ***H10B 43/10*** | (2023.01) |
| ***H10B 43/27*** | (2023.01) |
| ***H10B 43/35*** | (2023.01) |
| ***H10B 43/50*** | (2023.01) |

(56) References Cited

U.S. PATENT DOCUMENTS

| | | | | |
|---|---|---|---|---|
| 2020/0098432 | A1* | 3/2020 | Shirakawa ............. | H10B 41/27 |
| 2022/0406384 | A1 | 12/2022 | Nakazawa | |

* cited by examiner

SEMICONDUCTOR MEMORY DEVICE

CROSS-REFERENCE TO RELATED APPLICATION(S)

This application is based upon and claims the benefit of priority from Japanese Patent Application No. 2023-037449, filed Mar. 10, 2023, the entire contents of which are incorporated herein by reference.

FIELD

An embodiment of the present disclosure relates to a semiconductor memory device.

BACKGROUND

Embodiments described herein relate generally to a NAND flash memory which is known as a type of non-volatile semiconductor memory device.

DETAILED DESCRIPTION

Figure 1:
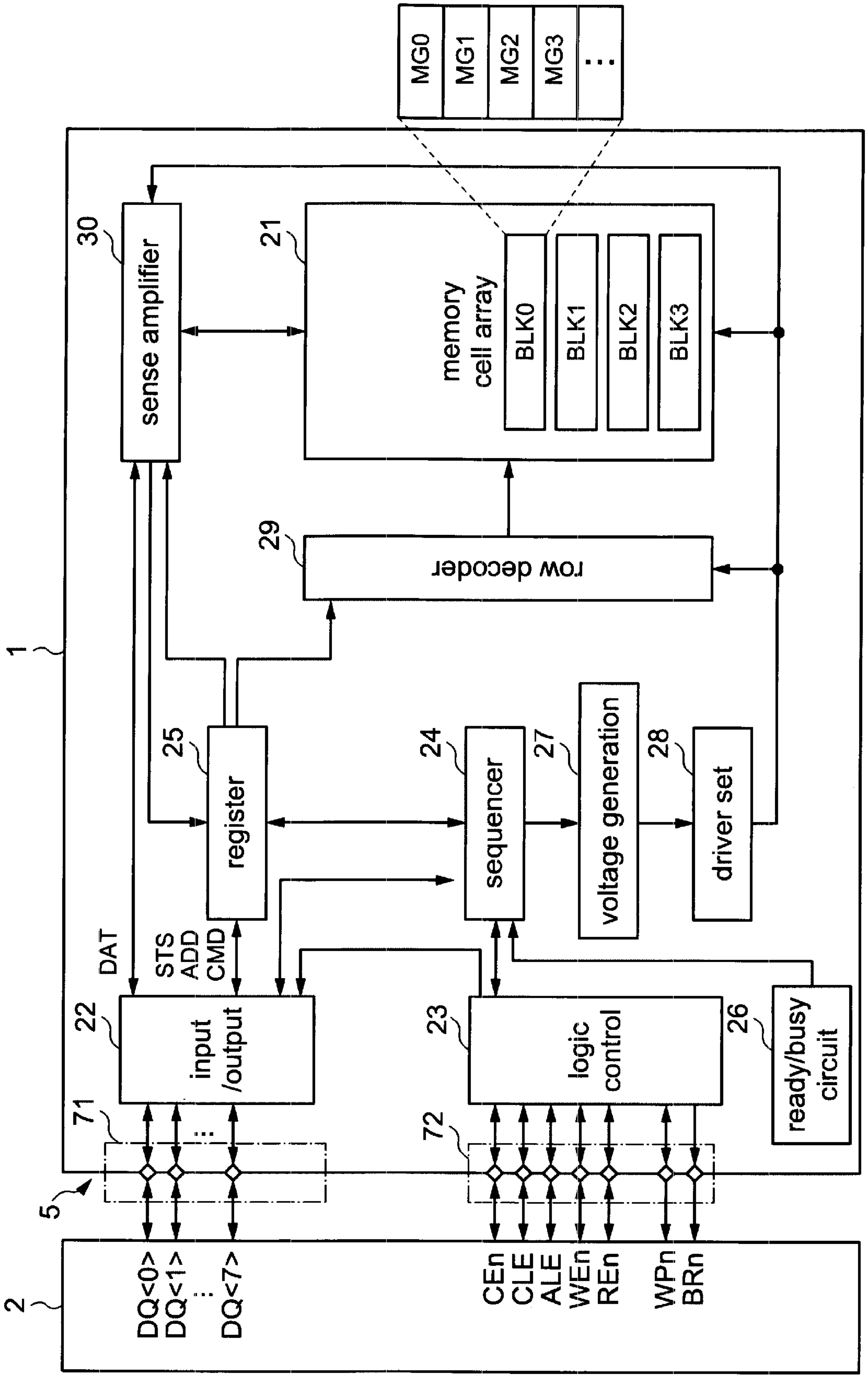
FIG. 1 is a block diagram showing an example of a configuration of a memory system including a semiconductor memory device according to a first embodiment.

Embodiments provide a semiconductor memory device in which power consumption and reliability of a memory cell are improved.

In general, according to one embodiment, a semiconductor memory device includes a first semiconductor pillar, a second semiconductor pillar, a first string provided on a first side of the first semiconductor pillar, and including a plurality of first memory cells electrically connected in series, a second string provided on a second side of the first semiconductor pillar, and including a plurality of second memory cells electrically connected in series, a third string provided on a first side of the second semiconductor pillar, and including a plurality of third memory cells electrically connected in series, a fourth string provided on a second side of the second semiconductor pillar, and including a plurality of fourth memory cells electrically connected in series, a plurality of first word lines, each of the first word lines electrically connected in common to one of the plurality of first memory cells and one of the plurality of third memory cells, a plurality of second word lines, each of the second word lines electrically connected in common to one of the plurality of second memory cells and one of the plurality of fourth memory cells, and a driver. The driver is configured to supply different voltages to the first and second word lines during an erasing operation to erase data in the plurality of second memory cells and the plurality of fourth memory cells. In the erasing operation, the driver supplies a first voltage higher than a reference voltage to the plurality of first word lines, and supplies the reference voltage to the plurality of second word lines.

Hereinafter, embodiments will be described with reference to the drawings. In the following description, elements having the same or similar functions and configurations are designated by common reference numerals. When a plurality of elements having the same reference numerals are to be distinguished from each other, the elements are distinguished by adding a subscript (for example, an uppercase letter of the alphabet, a lowercase letter of the alphabet, a hyphen and a lowercase letter of the alphabet, and a number) to the same reference numeral.

First Embodiment

A semiconductor memory device 1 according to a first embodiment will be described below.

Configuration Example

1-1. Memory System

FIG. 1 is a block diagram showing an example of a configuration of a memory system 3 including the semiconductor memory device 1 according to the first embodiment.

A configuration of a memory system 3 including the semiconductor memory device 1 according to the first embodiment is not limited to the configuration shown in FIG. 1.

As shown in FIG. 1, the memory system 3 includes the semiconductor memory device 1 and a memory controller 2. The memory system 3 is, for example, a memory card such as a solid state drive (SSD) or an SD® card. The memory system 3 may include a host device (not shown).

The semiconductor memory device 1 is connected to, for example, the memory controller 2 and is controlled by using the memory controller 2. The memory controller 2 receives, for example, an instruction required for the operation of the semiconductor memory device 1 from the host device, and transmits the instruction to the semiconductor memory device 1. The memory controller 2 transmits the instruction to the semiconductor memory device 1, and controls a data read operation from the semiconductor memory device 1, a data write operation to the semiconductor memory device 1, and a data erasing operation of the semiconductor memory device 1. In the first embodiment, the semiconductor memory device 1 is, for example, a NAND flash memory. Although the details will be described later, the write operation includes, for example, a program loop, and the program loop includes a program operation and a verification operation.

1-2. Configuration of Semiconductor Memory Device

As shown in FIG. 1, the semiconductor memory device 1 includes a memory cell array 21, an input/output circuit (input/output) 22, a logic control circuit (logic control) 23, a sequencer 24, a register 25, a ready/busy control circuit (ready busy circuit) 26, a voltage generation circuit (voltage generation) 27, a driver set 28, a row decoder 29, a sense amplifier module (sense amplifier) 70, an input/output pad group 71, and a logic control pad group 72. In the semiconductor memory device 1, various operations such as a write operation of storing write data DAT in the memory cell array 21, a read operation of reading read data DAT from the memory cell array 21, and the like are executed. A configuration of the semiconductor memory device 1 according to the first embodiment is not limited to the configuration shown in FIG. 1.

The memory cell array 21 is connected to, for example, the sense amplifier module 70, the row decoder 29, and the driver set 28. The memory cell array 21 includes blocks BLKO, BLK1, . . . , and BLKn (n is an integer of 1 or more). Although details will be described later, each of the blocks BLK includes a plurality of memory groups MG (MG0, MG1, MG2, . . . ). Each of the memory groups MG includes a plurality of non-volatile memory cells associated with a bit line and a word line. In the semiconductor memory device 1, the memory cell transistor MT may be simply referred to as a memory cell.

In the semiconductor memory device 1, for example, a triple-level cell (TLC) method or a quadruple-level cell (QLC) method may be used to program the memory cells. In the TLC method, 3 bits of data are stored in each memory cell, and in the QLC method, 4 bits of data are stored in each memory cell. Alternatively, two bits or less of data may be stored in each memory cell, or five bits or more of data may be stored in each memory cell.

The input/output circuit 22 is connected to, for example, the register 25, the logic control circuit 23, and the sense amplifier module 70. The input/output circuit 22 controls the communication of the data signal DQ<7:0> between the memory controller 2 and the semiconductor memory device 1.

The data signal DQ<7:0> is an 8-bit signal. The data signal DQ<7:0> contains data communicated between the semiconductor memory device 1 and the memory controller 2, and includes a command CMD, data DAT, address information ADD, status information STS, and the like. The command CMD includes, for example, an instruction for executing an instruction transmitted from the host device to the semiconductor memory device 1 via the memory controller 2. The data DAT includes write data DAT to the semiconductor memory device 1 or read data DAT from the semiconductor memory device 1. The address information ADD includes, for example, a column address and a row address for selecting a plurality of non-volatile memory cells associated with a bit line and a word line. The status information STS includes, for example, information regarding the status of the semiconductor memory device 1 with respect to the write operation and the read operation.

More specifically, the input/output circuit 22 includes an input circuit and an output circuit, and the input circuit and the output circuit perform the following processing. The input circuit receives write data DAT, address information ADD, and a command CMD from the memory controller 2. The input circuit transmits the received write data DAT to the sense amplifier module 70, and transmits the received address information ADD and the received command CMD to the register 25. On the other hand, the output circuit receives the status information STS from the register 25 and receives the read data DAT from the sense amplifier module 70. The output circuit transmits the received status information STS and the read data DAT to the memory controller 2.

The logic control circuit 23 is connected to, for example, the memory controller 2 and the sequencer 24. The logic control circuit 23 receives, for example, the chip enable signal CEn, the command latch enable signal CLE, the address latch enable signal ALE, the write enable signal WEn, the read enable signal REn, and the write protect signal WPn from the memory controller 2. The logic control circuit 23 controls the input/output circuit 22 and the sequencer 24 based on the received signal.

The chip enable signal CEn is a signal for enabling the semiconductor memory device 1. The command latch enable signal CLE is a signal for notifying the input/output circuit 22 that the signal DQ input to the semiconductor memory device 1 is the command CMD. The address latch enable signal ALE is a signal for notifying the input/output circuit 22 that the signal DQ input to the semiconductor memory device 1 is the address information ADD. The write enable signal WEn and the read enable signal REn are signals for, for example, instructing the input and output of the data signal DQ to and from the input/output circuit 22. The write protect signal WPn is a signal for instructing the semiconductor memory device 1 to perform data write and erasing protection.

The sequencer 24 is connected to, for example, the ready/busy control circuit 26, the sense amplifier module 70, and the driver set 28. The sequencer 24 controls the operation of the entire semiconductor memory device 1 based on the command CMD stored in the command register. For example, the sequencer 24 controls the sense amplifier module 70, the row decoder 29, the voltage generation circuit 27, the driver set 28, and the like to execute various operations such as a write operation and a read operation.

The register 25 includes, for example, a status register (not shown), an address register (not shown), a command register (not shown), and the like. The status register receives and stores the status information STS from the sequencer 24, and transmits the status information STS to the input/output circuit 22 based on an instruction of the sequencer 24. The address register receives and stores the address information ADD from the input/output circuit 22. The address register transmits the column address in the address information ADD to the sense amplifier module 70 and transmits the row address in the address information ADD to the row decoder 29. The command register receives and stores the command CMD from the input/output circuit 22, and transmits the command CMD to the sequencer 24.

The ready/busy control circuit 26 generates the ready/busy signal R/Bn in accordance with the control by the sequencer 24, and transmits the generated ready/busy signal R/Bn to the memory controller 2. The ready/busy signal R/Bn is a signal for notifying whether the semiconductor memory device 1 is in a ready state in which state it is able to receive the instruction from the memory controller 2 or in a busy state in which state it is unable to receive the instruction.

The voltage generation circuit 27 is connected to, for example, the driver set 28 or the like. The voltage generation circuit 27 generates a voltage that is used for operations such as a write operation and a read operation, based on the control by the sequencer 24, and supplies the generated voltage to the driver set 28.

Figure 7:
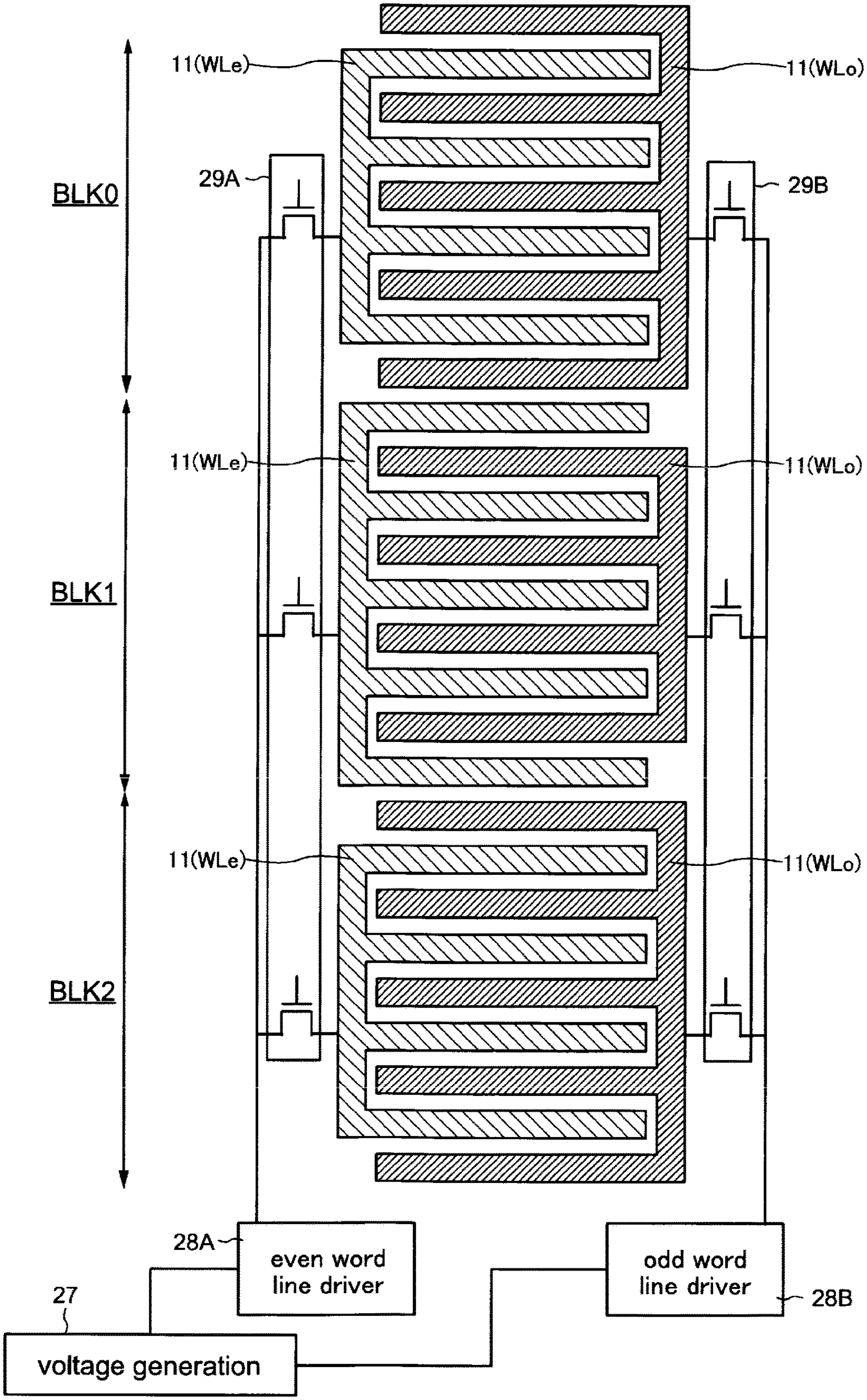
FIG. 7 is a diagram showing an electrical connection of a voltage generation circuit, a driver set, a select gate line, or a word line according to the first embodiment.

The driver set 28 includes, for example, an even word line driver 28A (FIG. 7) and an odd word line driver 28B (FIG. 7). The driver set 28 is connected to the memory cell array 21, the sense amplifier module 70, and the row decoder 29. The driver set 28 generates various voltages or various control signals to be supplied to the select gate line SGD (FIG. 2), the word line WL (FIG. 2), the source line SL (FIG. 2), the bit line BL (FIG. 2), and the like in various operations such as a read operation and a write operation, for example, based on the voltage supplied from the voltage generation circuit 27 or the control signal supplied from the sequencer 24. The driver set 28 supplies the generated voltages or the control signals to the sense amplifier module 70, the row decoder 29, the source line SL, and the like.

The row decoder 29 receives a row address from the address register and decodes the received row address. The row decoder 29 selects a block BLK for executing various operations such as a read operation and a write operation based on the result of the decoding. The row decoder 29 is capable of supplying the voltage supplied from the driver set 28 to the selected block BLK. The row decoder 29 includes, for example, a row decoder 29A (FIG. 7) and a row decoder 29B (FIG. 7).

The sense amplifier module 70 receives a column address from an address register, and decodes the received column address, for example. The sense amplifier module 70 executes a communication operation of the data DAT between the memory controller 2 and the memory cell array 21 based on the result of the decoding. The sense amplifier module 70 includes, for example, a sense amplifier module unit (not shown) provided for each of the bit lines BL (BL0 to BL(L-1), where (L-1) is a natural number of 2 or more). The sense amplifier module unit is electrically connected to the bit line BL so as to be able to supply a voltage to the bit line BL. For example, the sense amplifier module 70 is capable of supplying a voltage to the bit line BL using a sense amplifier module unit. Further, the sense amplifier module 70 senses the data read from the memory cell array 21 based on the instruction related to the read operation, generates the read data DAT, and transmits the generated read data DAT to the memory controller 2 via the input/output circuit 22. Further, the sense amplifier module 70 receives the write data DAT from the memory controller 2 via the input/output circuit 22 based on the instruction related to the write operation, and transmits the received write data DAT to the memory cell array 21.

The input/output pad group 71 transmits the data signal DQ<7:0> received from the memory controller 2 to the input/output circuit 22. The input/output pad group 71 transmits the data signal DQ<7:0> received from the input/output circuit 22 to the memory controller 2.

The logic control pad group 72 transfers the chip enable signal CEn, the command latch enable signal CLE, the address latch enable signal ALE, the write enable signal WEn, and the read enable signal REn received from the memory controller 2 to the logic control circuit 23. The logic control pad group 72 transfers the ready/busy signal R/Bn received from the ready/busy control circuit 26 to the memory controller 2.

1-3. Memory Cell Array

Figure 2:
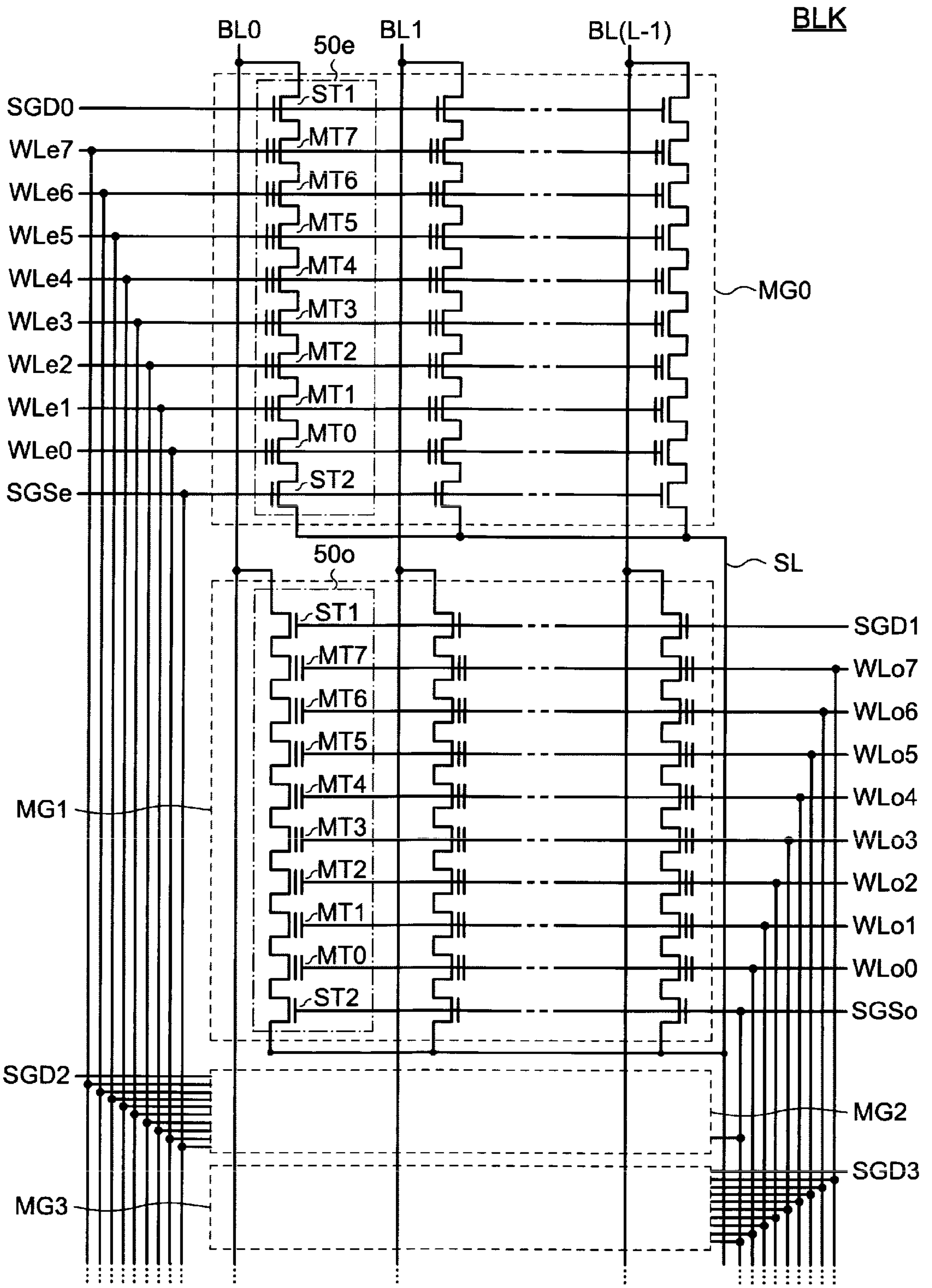
FIG. 2 is a diagram showing a circuit configuration of a memory cell array in the semiconductor memory device according to the first embodiment.

FIG. 2 is an example of a circuit configuration of the memory cell array 21 shown in FIG. 1. FIG. 2 is a diagram showing a circuit configuration of one block BLK of the plurality of blocks BLK provided in the memory cell array 21. For example, each of the plurality of blocks BLK provided in the memory cell array 21 has the circuit configuration shown in FIG. 2. The configuration of the memory cell array 21 according to the first embodiment is not limited to the configuration shown in FIG. 2. In the description of FIG. 2, the description of the same or similar configurations as those in FIG. 1 may be omitted.

As shown in FIG. 2, the block BLK includes a plurality of memory groups MG (MG0, MG1, MG2, and MG3). In the present embodiment, each of the memory groups MG includes a plurality of memory strings 50. For example, the memory groups MG0 and MG2 include a plurality of memory strings 50*e*, and the memory groups MG1 and MG3 include a plurality of memory strings 50*o*.

Each of the memory strings 50 includes, for example, 8 memory cell transistors MT (MT0 to MT7), and select transistors ST1 and ST2. The memory cell transistor MT includes a gate (control gate) and a charge storage layer, and stores data in a non-volatile manner. The memory cell transistors MT are connected in series between the source of the select transistor ST1 and the drain of the select transistor ST2.

The gate of the select transistor STI in each of the memory groups MG is connected to each of the select gate lines SGD (SGD0, SGD1, . . . ). The select gate line SGD is independently controlled by the row decoder 29. In addition, the gate of the select transistor ST2 in each of the even memory groups MGe (MG0, MG2, . . . ) is connected to, for example, the even select gate line SGSe, and the gate of the select transistor ST2 in each of the odd memory groups MGo (MG1, MG3, . . . ) is connected to, for example, the odd select gate line SGSo. The even select gate line SGSe and the odd select gate line SGSo may be connected to each other, for example, and may be similarly controlled, and may be provided independently and may be independently controllable.

The control gates of the memory cell transistors MT (MT0 to MT7) provided in the memory group MGe in the same block BLK are commonly connected to the word lines WLe (WLe0 to WLe7). The control gates of the memory cell transistors MT (MT0 to MT7) provided in the memory group MGo in the same block BLK are commonly connected to the word lines WLo (WLo0 to WLo7). The word line WLe and the word line WLo are independently controlled by the row decoder 29. The block BLK is, for example, a unit for erasing data. Data stored by the memory cell transistors MT (FIG. 2) connected to the word lines WLe (WLe0 to WLe7) or the word lines WLo (WLo0 to WLo7) in the block BLK in common is erased all at once.

Each memory group MG includes a plurality of pages corresponding to a plurality of word lines WL. For example, in the memory group MG0 or the memory group MG2, a plurality of memory cell transistors MT in which the control gates are commonly connected to any of the word lines WLe0 to WLe7 correspond to a page. In addition, in the memory group MG1 or the memory group MG3, a plurality of memory cell transistors MT in which the control gates are commonly connected to any of the word lines WLo0 to WLo7 correspond to a page. The write operation and the read operation are executed in units of pages.

The drains of the select transistors STI of the memory strings 50 in the identical column in the memory cell array 21 are commonly connected to the bit lines BL (BL0 to BL(L-1), where (L-1) is a natural number of 2 or more). That is, the bit lines BL are commonly connected to the memory strings 50 across the plurality of memory groups MG. The sources of the plurality of select transistors ST2 are commonly connected to the source line SL. The source line SL is electrically connected to the driver set 28, for example, and the voltage is supplied from the voltage generation circuit 27 or the driver set 28 through control of the voltage generation circuit 27 and the driver set 28 using the sequencer 24. In addition, the semiconductor memory device 1 may include a plurality of source lines SL. For example, each of the plurality of source lines SL may be electrically connected to the driver set 28, and each of the plurality of source lines SL may be supplied with different voltages from the voltage generation circuit 27 or the driver set 28 through control of the voltage generation circuit 27 and the driver set 28 using the sequencer 24.

The memory group MG includes a plurality of memory strings 50 connected to different bit lines BL and connected to the same select gate line SGD. The block BLK includes a plurality of memory groups MG sharing the word line WL. The memory cell array 21 includes a plurality of blocks BLK sharing the same bit lines BL. In the memory cell array 21, the select gate line SGS, the word line WL, and the select gate line SGD described above are stacked above the source line layer, and the memory cell transistors MT are stacked and arranged in three dimensions.

1-4. Planar Layout of Memory Cell Array

Figure 3:
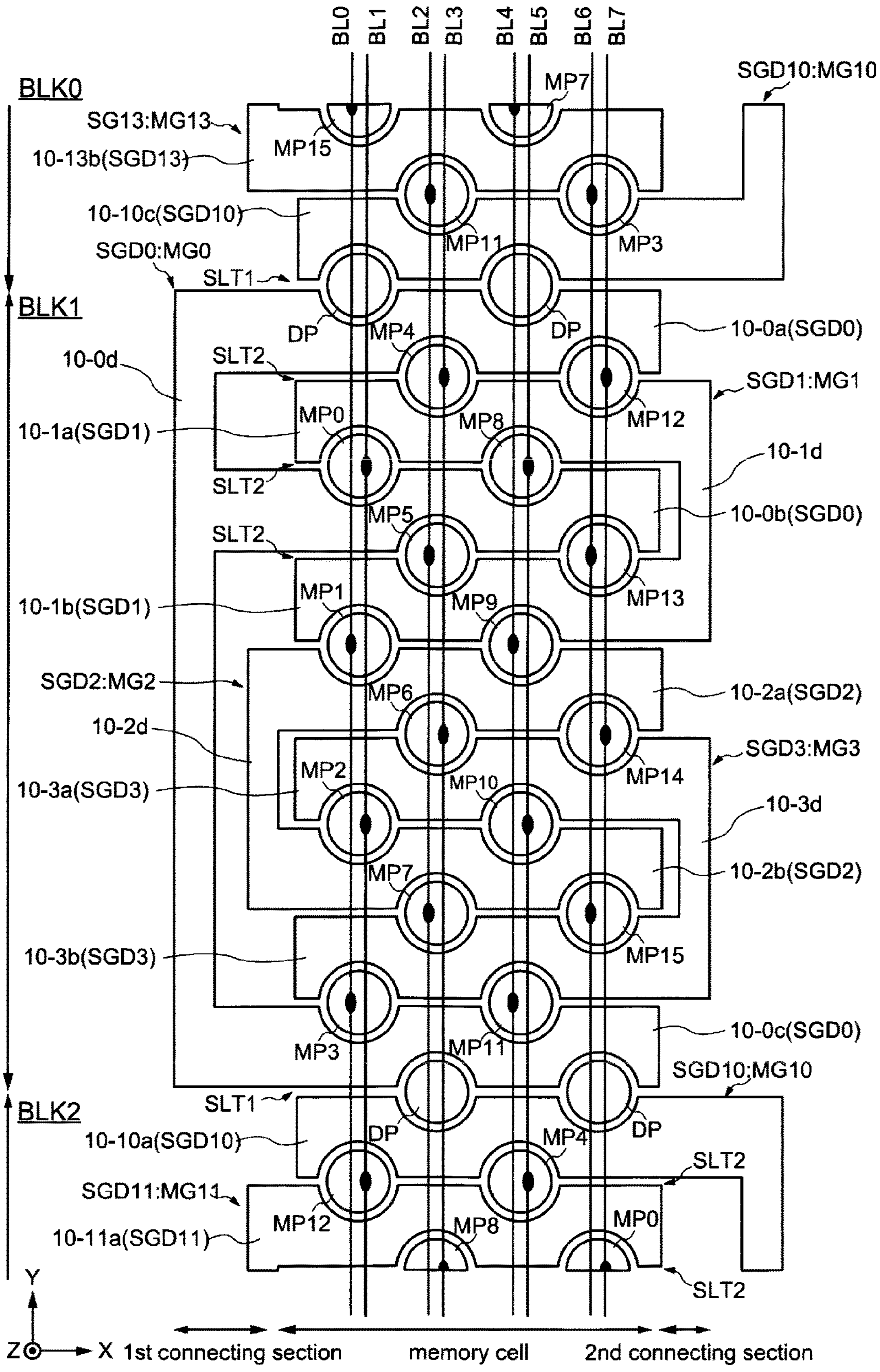
FIG. 3 is a diagram showing a planar layout of a drain-side select gate line, a bit line, and a memory pillar according to the first embodiment.

FIG. 3 is a diagram showing a planar layout of the select gate lines SGD in the in-plane (XY plane) parallel to the source line layers of the blocks BLK0 to BLK2. As shown in FIG. 3, in the semiconductor memory device 1 according to the first embodiment, for example, four select gate lines SGD are provided in one block BLK1. The planar layout of the select gate lines SGD according to the first embodiment is not limited to the layout shown in FIG. 3. In the description of FIG. 3, the description of the same or similar configurations as those in FIGS. 1 and 2 may be omitted. In addition, since the planar layout of the select gate lines SGD of the blocks BLK0 and BLK2 is obtained by left-right (even-odd) inversion of the planar layout of the select gate lines SGD of the block BLK1, the description thereof will be omitted. Here, the select gate lines SGD of the blocks BLK0 and BLK2 are identified by adding 10 to the suffix of the reference number 10.

As shown in FIG. 3, in the semiconductor memory device 1 according to the first embodiment, for example, the three wiring layers 10-0*a*, 10-0*b*, and 10-0*c* extending in the X direction are connected using a first connecting section 10-0*d* extending in the Y direction. The wiring layers 10-0*a* and 10-0*c* are positioned at both ends in the Y direction. The wiring layer 10-0*a* and the wiring layer 10-0*b* are adjacent to and interposed by wiring layer 10-1*a* in the Y direction. The first connecting section 10-0*d* is positioned at one end in the X direction. The three wiring layers 10-0*a*, 10-0*b*, and 10-0*c* function as select gate line SGD0. In the first embodiment, for example, the Y direction is a direction orthogonal to the X direction or a direction substantially orthogonal to the X direction.

The wiring layers 10-1*a* and 10-1*b* extending in the X direction are connected to each other using a second connecting section 10-1*d* extending in the Y direction. The wiring layer 10-1*a* is positioned between the wiring layers 10-0*a* and 10-0*b*. The wiring layer 10-1*b* is positioned between the wiring layer 10-0*b* and wiring layer 10-2*a*. The second connecting section 10-1*d* is positioned on the side opposite to the first connecting section 10-0*d* in the X direction. The two wiring layers 10-1*a* and 10-1*b* function as select gate line SGD1.

The wiring layers 10-2*a* and 10-2*b* extending in the X direction are connected by the first connecting section 10-2*d* extending in the Y direction. Similarly, the wiring layers 10-3*a* and 10-3*b* extending in the X direction are connected by the second connecting section 10-3*d* extending in the Y direction. The wiring layer 10-2*a* is positioned between the wiring layer 10-1*b* and the wiring layer 10-3*a*. The wiring layer 10-3*a* is positioned between the wiring layer 10-2*a* and the wiring layer 10-2*b*. The wiring layer 10-2*b* is positioned between the wiring layer 10-3*a* and the wiring layer 10-3*b*. The wiring layer 10-3*b* is positioned between the wiring layer 10-2*b* and the wiring layer 10-0*c*. The first connecting section 10-2*d* is positioned at one end on the same side as the first connecting section 10-0*d* in the X direction. The second connecting section 10-3*d* is positioned at the other end of the first connecting section 10-0*d* on the side opposite to the first connecting section 10-0*d* in the X direction. The two wiring layers 10-2*a* and 10-2*b* function as select gate line SGD2. The two wiring layers 10-3*a* and 10-3*b* function as select gate line SGD3.

The first embodiment employs a configuration in which each of the wiring layers is connected by using the first connecting sections 10-0*d* and 10-2*d* or the second connecting sections 10-1*d* and 10-3*d*, but is not limited to this configuration. For example, each of the wiring layers may be independent, in which case each of the wiring layers is controlled such that the wiring layers 10-0*a*, 10-0*b*, and 10-0*c* are supplied with the same voltage, the wiring layers 10-1*a* and 10-1*b* are supplied with the same voltage, the wiring layers 10-2*a* and 10-2*b* are supplied with the same voltage, and the wiring layers 10-3*a* and 10-3*b* are supplied with the same voltage.

The memory group MG corresponding to the wiring layers 10-0*a*, 10-0*b*, and 10-0*c* is referred to as MG0. The memory group MG corresponding to the wiring layers 10-1*a* and 10-1*b* is referred to as MG1. The memory group MG corresponding to the wiring layers 10-2*a* and 10-2*b* is referred to as MG2. The memory group MG corresponding to the wiring layers 10-3*a* and 10-3*b* is referred to as MG3.

The wiring layers 10 adjacent to each other in the Y direction in the block BLK are insulated. A region where the adjacent wiring layers 10 are insulated is referred to as a slit SLT2. In the slit SLT2, for example, a region from a plane parallel to the source line layer to the layer where at least the wiring layers 10 are provided is embedded using an insulating film (not shown).

In the memory cell array 21, for example, as shown in FIG. 3, a plurality of blocks BLK0, BLK1, and BLK2 are arranged in the Y direction. As in the wiring layers 10 adjacent to each other in the Y direction in one block BLK, the blocks BLK adjacent to each other in the Y direction are separated by an insulating film (not shown) so as to be insulated from each other. A region where the adjacent blocks BLK are insulated from each other is referred to as a slit SLT1. Similar to the slit SLT2, in the slit SLT1, the insulating film embeds a region from a plane parallel to the source line layer to the layer where at least the wiring layers 10 are provided.

A plurality of memory pillars MP (MP0 to MP15) are provided between the wiring layers 10 adjacent to each other in the Y direction. The plurality of memory pillars MP are provided in a memory cell section. Each of the plurality of memory pillars MP is provided along the Z direction. In the first embodiment, for example, the Z direction is a direction orthogonal to or substantially orthogonal to the XY direction, and is a direction orthogonal to or substantially orthogonal to a plane parallel to the source line layer.

Specifically, memory pillars MP4 and MP12 are provided between the wiring layers 10-0*a* and 10-1*a*. Memory pillars MP0 and MP8 are provided between the wiring layers 10-1*a* and 10-0*b*. Memory pillars MP5 and MP13 are provided between the wiring layers 10-0*b* and 10-1*b*. Memory pillars MP1 and MP9 are provided between the wiring layers 10-1*b* and 10-2*a*. Memory pillars MP6 and MP14 are provided between the wiring layers 10-2*a* and 10-3*a*. Memory pillars MP2 and MP10 are provided between the wiring layers 10-3*a* and 10-2*b*. Memory pillars MP7 and MP15 are provided between the wiring layers 10-2*b* and 10-3*b*. Memory pillars MP3 and MP11 are provided between the wiring layers 10-3*b* and 10-0*c*.

The memory pillar MP is a structure along which the select transistors ST1 and ST2 and the memory cell transistors MT are formed. The detailed structure of the memory pillar MP will be described later.

The memory pillars MP0 to MP3 are arranged along the Y direction. The memory pillars MP8 to MP11 are arranged along the Y direction at positions aligned with the memory pillars MP0 to MP3, respectively, in the X direction. That is, the memory pillars MP0 to MP3 and the memory pillars MP8 to MP11 are arranged in parallel.

The memory pillars MP4 to MP7 and the memory pillars MP12 to MP15 are arranged along the Y direction, respectively. The memory pillars MP4 to MP7 are positioned between the memory pillars MP0 to MP3 and the memory pillars MP8 to MP11 in the X direction. The memory pillars MP12 to MP15 are positioned to interpose the memory pillars MP8 to MP11 together with the memory pillars MP4 to MP7 in the X direction. That is, the memory pillars MP4 to MP7 and the memory pillars MP12 to MP15 are arranged in parallel and respectively aligned in the X direction.

Two bit lines BL0 and BL1 are provided above the memory pillars MP0 to MP3. The bit line BL0 is commonly connected to the memory pillars MP1 and MP3. The bit line BL1 is commonly connected to the memory pillars MP0 and MP2. Two bit lines BL2 and BL3 are provided above the memory pillars MP4 to MP7. The bit line BL2 is commonly connected to the memory pillars MP5 and MP7. The bit line BL3 is commonly connected to the memory pillars MP4 and MP6. Two bit lines BL4 and BL5 are provided above the memory pillars MP8 to MP11. The bit line BL4 is commonly connected to the memory pillars MP9 and MP11. The bit line BL5 is commonly connected to the memory pillars MP8 and MP10. Two bit lines BL6 and BL7 are provided above the memory pillars MP12 to MP15. The bit line BL6 is commonly connected to the memory pillars MP13 and MP15. The bit line BL7 is commonly connected to the memory pillars MP12 and MP14. In the example of the planar layout shown in FIG. 3, only eight bit lines (bit lines BL0 to BL7) are shown. However, for example, the number of bit lines may be provided corresponding to the data length of 4 kByte, 8 kByte, or 16 kByte, and the number of bit lines is not limited to any particular number.

As described above, the memory pillar MP is provided at a position bridging the two wiring layers 10 in the Y direction, and is embedded in a part of one of the plurality of slits SLT2. In addition, one slit SLT2 is provided between the memory pillars MP that are aligned and adjacent to each other in the Y direction.

A dummy pillar DP is provided between the wiring layer 10-0*a* of the block BLK1 and the wiring layer 10-10*c* of the block BLK0, which is adjacent to the block BLK1 with the slit SLT1 interposed between it and the block BLK1. A dummy pillar DP is provided between the wiring layer 10-0*c* of the block BLK1 and the wiring layer 10-10*a* of the block BLK2, which is adjacent to the block BLK1 with the slit SLT1 interposed between it and the block BLK1. The dummy pillar DP has the same structure as the memory pillar MP, but is not connected to the bit line BL. However, the structure of the dummy pillar DP is not limited to any particular structure.

Figure 4:
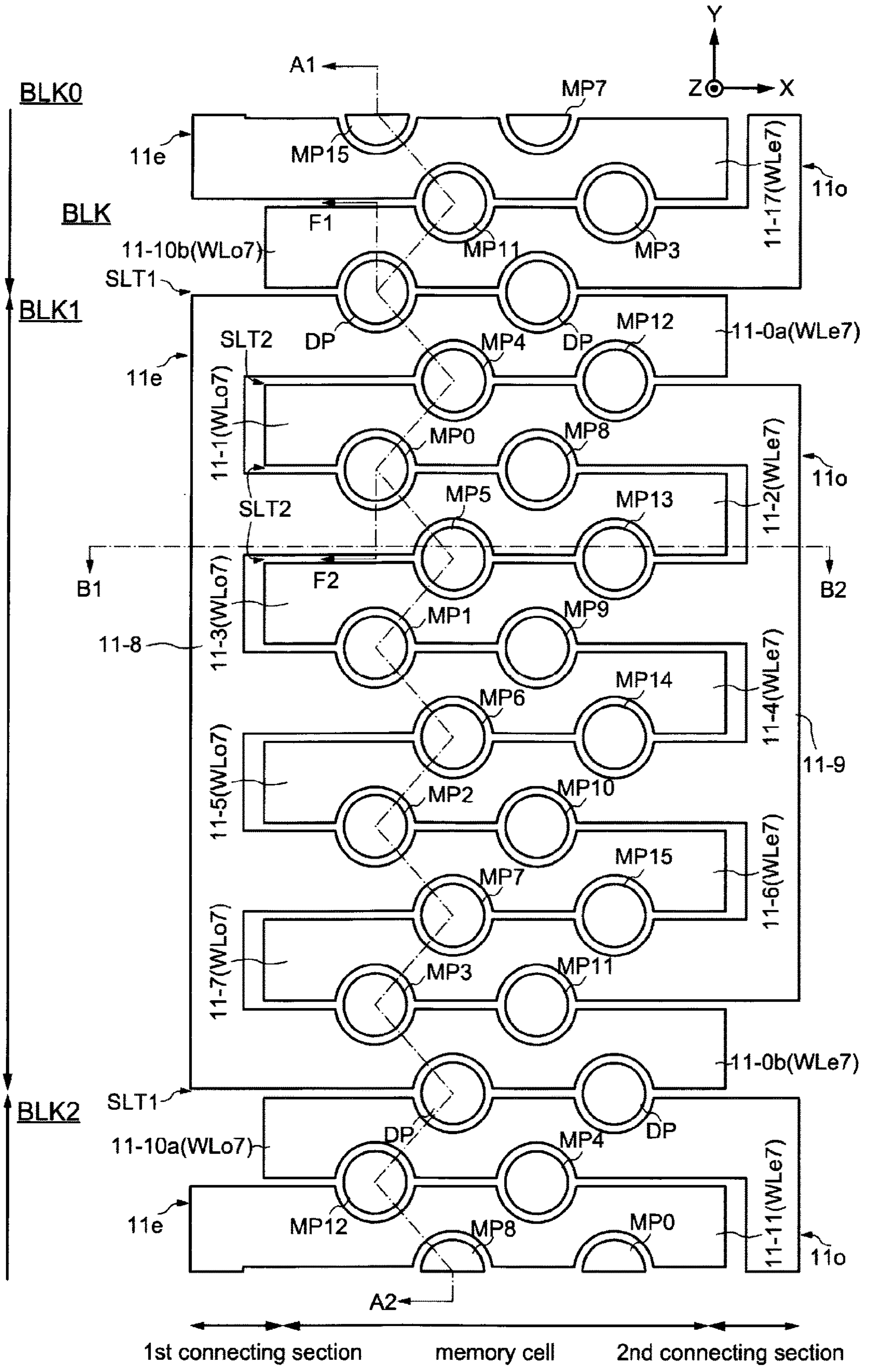
FIG. 4 is a diagram showing a planar layout of a word line and the memory pillar according to the first embodiment.

FIG. 4 is a diagram showing a planar layout of the word lines WL in the XY plane. The layout shown in FIG. 4 corresponds to the layout of FIG. 3 and is a layout of a wiring layer 11 provided in a lower layer than the wiring layer 10 shown in FIG. 3. In the description of FIG. 4, the description of the same or similar configurations as those in FIGS. 1 to 3 may be omitted. In addition, since the planar layout of the word lines WL of the blocks BLK0 and BLK2 is obtained by left-right (even-odd) inversion of the planar layout of the word lines WL of the block BLK1, the description thereof will be omitted. Here, the word lines WL of the blocks BLK0 and BLK2 are identified by adding 10 to the suffix of the reference number 11.

As shown in FIG. 4, nine wiring layers 11 (wiring layers 11-0 to 11-7, where the wiring layer 11-0 includes a wiring layer 11-0*a* and a wiring layer 11-0*b*) extending in the X direction are arranged along the Y direction. The wiring layers 11-0 to 11-7 are arranged under the wiring layers 10-0 to 10-3 in the Z direction. An insulating film is provided between the wiring layers 11-0 to 11-7 and the wiring layers 10-0 to 10-3, and the wiring layers 11-0 to 11-7 and the wiring layers 10-0 to 10-3 are insulated from each other.

Each of the wiring layers 11 functions as a word line WL7. The other word lines WL0 to WL6 also have the same configuration and function as word line WL7. In the example shown in FIG. 4, the wiring layers 11-0*a*, 11-2, 11-4, 11-6, and 11-0*b* function as word lines WLe7. The wiring layers 11-0*a*, 11-2, 11-4, 11-6, and 11-0*b* are connected to each other using the first connecting section 11-8 extending in the Y direction. The first connecting section 11-8 is provided at one end in the X direction. In the first connecting section 11-8, the wiring layers 11-0*a*, 11-2, 11-4, 11-6, and 11-0*b* are connected to the row decoder 29. In the first embodiment, the first connecting section 11-8 and the wiring layers 11-0*a*, 11-2, 11-4, 11-6, and 11-0*b* may be collectively referred to as a wiring layer 11*e*.

In addition, the wiring layers 11-1, 11-3, 11-5, and 11-7 function as word lines WLo7. The wiring layers 11-1, 11-3, 11-5, and 11-7 are connected to each other using a second connecting section 11-9 extending in the Y direction. The second connecting section 11-9 is provided at the other end of the first connecting section 11-8 on the side opposite to the first connecting section 11-8 in the X direction. In the second connecting section 11-9, the wiring layers 11-1, 11-3, 11-5, and 11-7 are connected to the row decoder 29. In the first embodiment, the second connecting section 11-9 and the wiring layers 11-1, 11-3, 11-5, and 11-7 may be collectively referred to as a wiring layer 110.

The memory cell section is provided between the first connecting section 11-8 and the second connecting section 11-9. In the memory cell section, the wiring layers 11 adjacent to each other in the Y direction are separated from each other by the slit SLT2 shown in FIG. 3. The memory cell section includes memory pillars MP0 to MP15 as in FIG. 3. The wiring layers 11 adjacent to each other in the Y direction in the block BLK are alternately arranged between the wiring layer 110 and the wiring layer 11*e*.

In addition, the wiring layer 11 between the blocks BLK adjacent to each other in the Y direction is separated by the slit SLT1, similar to the slit SLT2. The wiring layers 11 adjacent to each other between the blocks BLK in the Y direction are also alternately arranged between the wiring layer 110 and the wiring layer 11*e*.

The select gate line SGS and the word lines WL0 to WL6 have the same configuration as the word lines WL7 shown in FIG. 4.

1-5. Sectional End Face Structure of Memory Cell Array

Figure 5:
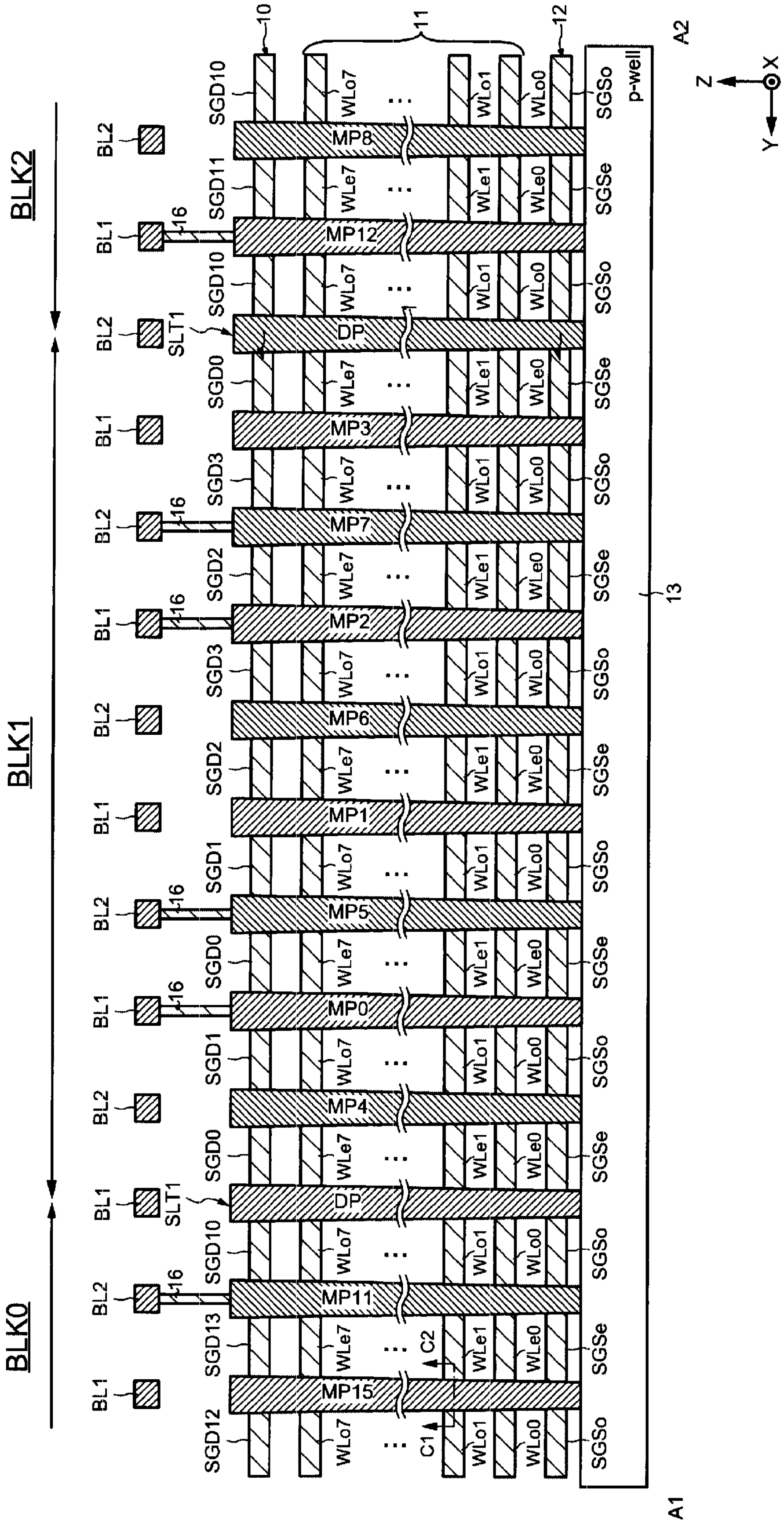
FIG. 5 is a sectional view taken along A1-A2 of the semiconductor memory device shown in FIG. 4.

FIG. 5 is a view showing an A1-A2 cut sectional end face shown in FIG. 4. The sectional end face of the block BLK according to the first embodiment is not limited to the sectional end face shown in FIG. 5. In the description of FIG. 5, the description of the same or similar configurations as those in FIGS. 1 to 4 may be omitted.

As shown in FIG. 5, the wiring layer 12 is provided above the p-well region (p-well) of the semiconductor substrate 13 along the Z direction. The semiconductor substrate 13 functions as, for example, a source line SL. The wiring layer 12 functions as, for example, a select gate line SGS. The eight wiring layers 11 are stacked above the wiring layer 12 along the Z direction. The eight wiring layers 11 function as, for example, word lines WL and correspond to the word lines WL0 to WL7 in a one-to-one manner. The wiring layer 10 is provided above the uppermost wiring layer 11 among the eight wiring layers 11. The wiring layer 10 functions as, for example, a select gate line SGD. FIG. 4 is a diagram showing a planar layout of the wiring layer 11 functioning as the word line WL, and FIG. 3 is a diagram showing a planar layout of the wiring layer 10 functioning as the select gate line SGD. The planar layout of the wiring layer 12 functioning as the select gate line SGS is, for example, a layout in which the wiring layer 11 functioning as the word line WL shown in FIG. 4 is replaced with the wiring layer 12 functioning as the select gate line SGS.

In the semiconductor memory device 1, the source line SL is provided on the main surface of the semiconductor substrate 13. The source line SL may have a configuration in which the conductive layer that is not patterned extends in the region of the memory cell array 21, or may have a configuration in which the conductive layer that is patterned in a linear shape extends in the region. In other words, the source line SL extends in the X direction and the Y direction.

The wiring layer 12 functions as an even select gate line SGSe and an odd select gate line SGSo. The even select gate line SGSe and the odd select gate line SGSo are alternately arranged in the Y direction via the slit SLT2. A memory pillar MP is provided between the even select gate line SGSe and the odd select gate line SGSo adjacent to each other in the Y direction. The even select gate line SGSe and the odd select gate line SGSo need not be electrically independently driven. The even select gate line SGSe and the odd select gate line SGSo may be electrically connected to each other.

The wiring layer 11 functions as an even word line WLe and an odd word line WLo. The even word line WLe and the odd word line WLo are alternately arranged in the Y direction via the slit SLT2. A memory pillar MP is provided between the even word line WLe and the odd word line WLo adjacent to each other in the Y direction. A memory cell to be described later is provided between the memory pillar MP and the even word line WLe and between the memory pillar MP and the odd word line WLo.

The wiring layer 10 functions as select gate lines SGD (SGD0 to SGD3). Each of the select gate lines SG is alternately arranged in the Y direction via the slit SLT2. The select gate lines SGD0 and SGD1 are alternately arranged in the Y direction between the slit SLT1 and the memory pillar MP1. The select gate lines SGD2 and SGD3 are alternately arranged in the Y direction between the memory pillar MP1 and the memory pillar MP3. In addition, the select gate line SGD0 is disposed between the memory pillar MP3 and the slit SLT1. A memory pillar MP is provided between each of the select gate lines SGD adjacent to each other in the Y direction. The select gate lines SGD0 to SGD3 are electrically independently driven.

A slit SLT1 is provided between the blocks BLK adjacent to each other in the Y direction. As described above, an insulating layer and a dummy pillar DP are provided in the slit SLT1. The width of the slit SLT1 along the Y direction may be substantially the same as the width of the slit SLT2 along the Y direction.

As shown in FIGS. 3 and 5, a bit line BL is provided on the memory pillar MP. The memory pillar MP is electrically connected to the bit line BL via the contact plug 16. For example, the memory pillar MP0 and the bit line BL1 are connected to each other via the contact plug 16. In addition, the memory pillar MP1 and the bit line BL0 are connected via the contact plug 16, the memory pillar MP2 and the bit line BL1 are connected via the contact plug 16, and the memory pillar MP3 and the bit line BL0 are connected via the contact plug 16. In addition, the memory pillar MP4 and the bit line BL3 are connected via the contact plug 16, the memory pillar MP5 and the bit line BL2 are connected via the contact plug 16, the memory pillar MP6 and the bit line BL3 are connected via the contact plug 16, and the memory pillar MP7 and the bit line BL2 are connected via the contact plug 16. Similarly, in the region other than the cross section shown in FIG. 5, the memory pillars MP8 to MP11 are connected to the bit lines BL4 or BL5, and the memory pillars MP12 to MP15 are connected to the bit lines BL6 or BL7.

Figure 6:
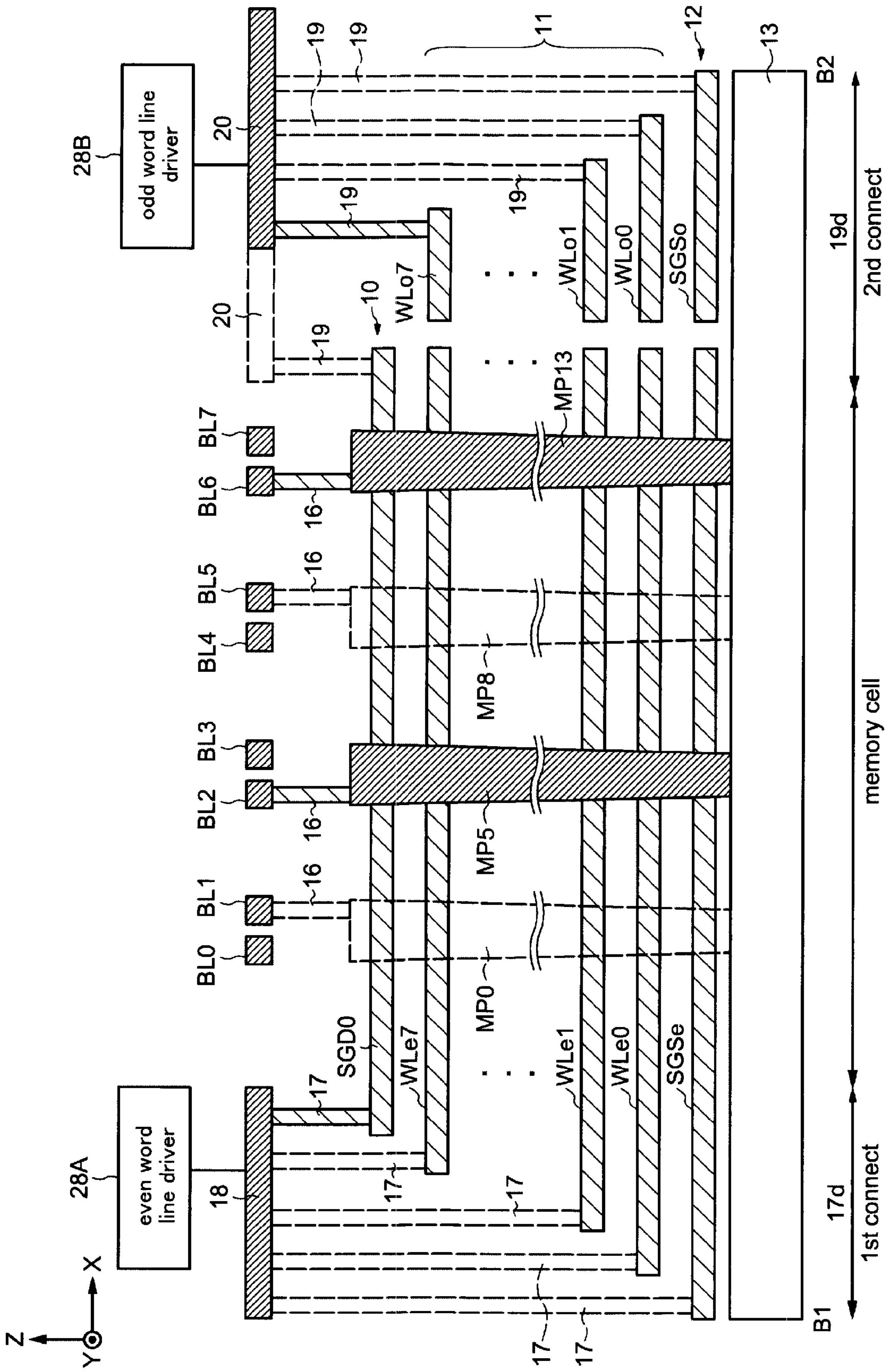
FIG. 6 is a sectional view taken along B1-B2 of the semiconductor memory device shown in FIG. 4.

FIG. 6 is a diagram showing B1-B2 cut sectional end face of the semiconductor memory device 1 shown in FIG. 4. The sectional end face of the block BLK according to the first embodiment is not limited to the sectional end face shown in FIG. 6. In the description of FIG. 6, the description of the same or similar configurations as those in FIGS. 1 to 5 may be omitted. Since the stacked structure of the semiconductor substrate 13, the wiring layer 12, the wiring layer 11, and the wiring layer 10 and the configuration of the memory cell section are as described with reference to FIG. 5, the description thereof will be omitted. In FIG. 6, the configuration present in the depth direction of the B1-B2 cut sectional end face is drawn by a dotted line.

As shown in FIG. 6, in a first connecting section 17*d*, the wiring layer 10, the wiring layer 11, and the wiring layer 12 are formed in a stepped shape, for example. That is, when being viewed in the XY plane, the upper surfaces of the respective end portions of the wiring layer 10, the eight wiring layers 11, and the wiring layer 12 are exposed in the first connecting section 17*d*. A contact plug 17 is provided on the upper surfaces of the respective end portions of the wiring layer 10, the eight wiring layers 11, and the wiring layer 12 exposed in the first connecting section 17*d*. The contact plug 17 is connected to a metal wiring layer 18. For example, the wiring layer 10 functioning as the select gate lines SGD0, SGD2, SGD4, and SGD6, the wiring layer 11 functioning as the even word line WLe, and the wiring layer 12 functioning as the even select gate line SGSe are electrically connected to the even word line driver 28A via the row decoder 29 (FIG. 1) using the metal wiring layer 18.

Similar to the first connecting section 17*d*, in a second connecting section 19*d*, the wiring layer 10, the wiring layer 11, and the wiring layer 12 are formed in a stepped shape, for example. When being viewed in the XY plane, the upper surfaces of the respective end portions of the wiring layer 10, the eight wiring layers 11, and the wiring layer 12 are exposed in the second connecting section 19*d*. The contact plug 19 is provided on the upper surface of the end portion of the wiring layer 10 exposed in the second connecting section 19*d* and on the upper surfaces of the end portions of the eight wiring layers 11 and the wiring layer 12, and the contact plug 19 is connected to the metal wiring layer 20. For example, the wiring layer 11 functioning as the select gate lines SGD1, SGD3, SGD5, and SGD7, and as the odd word line WLo and the wiring layer 12 functioning as the odd select gate line SGSo are electrically connected to the odd word line driver 28B via the row decoder 29 (FIG. 1) using the metal wiring layer 20.

Alternatively, the wiring layer 10 may be electrically connected to the row decoder 29 via the even word line driver 28A through the second connecting section 19*d* instead of the first connecting section 17*d*, or may be electrically connected to the row decoder 29 via the even word line driver 28A through both the first connecting section 17*d* and the second connecting section 19*d*. Similarly, the wiring layer 10 may be electrically connected to the row decoder 29 via the odd word line driver 28B through the first connecting section 17*d* instead of the second connecting section 19*d*, or may be electrically connected to the row decoder 29 via the odd word line driver 28B through both the first connecting section 17*d* and the second connecting section 19*d*.

FIG. 7 is a diagram showing an electrical connection of the voltage generation circuit 27, the driver set 28, the row decoder 29, and the word line WL according to the first embodiment. The electrical connection of the voltage generation circuit 27, the driver set 28, the row decoder 29, and the word line WL according to the first embodiment is not limited to that shown in FIG. 7. In the description of FIG. 7, the description of the same or similar configurations as those in FIGS. 1 to 6 may be omitted.

As shown in FIG. 7, the wiring layer 11 functioning as the even word line WLe may be connected to the even word line driver 28A via the row decoder 29A, and the wiring layer 11 functioning as the odd word line WLo may be electrically connected to the odd word line driver 28B via the row decoder 29B. As described above, the even word line driver 28A and the odd word line driver 28B are provided in the driver set 28. The driver set 28 is electrically connected to the voltage generation circuit 27. The even word line driver 28A and the odd word line driver 28B generate various voltages using the voltage supplied from the voltage generation circuit 27, the even word line driver 28A may supply the generated voltage to the even word line WLe, and the odd word line driver 28B may supply the generated voltage to the odd word line WLo.

The even word line driver 28A may supply the generated voltage to the even word lines WLe of each block BLK via the word line switch WLSW of the row decoder 29A. Further, the odd word line driver 28B may supply the generated voltage to the odd word lines WLo of each block BLK via the word line switch WLSW of the row decoder 29B. The row decoder 29A and the row decoder 29B are provided in the row decoder 29. The word line switch WLSW is provided in the row decoder 29A and the row decoder 29B. The word line switch WLSW functions as a switch for turning on or off the voltage transfer from the driver set 28 to each word line WL by the block select signal BLKSEL supplied from the block decoder. The even word line WLe and the odd word line WLo of each block BLK (BLK0 to BLK2) are each independently controlled by the word line switch WLSW of the row decoder 29.

1-6. Sectional End Face Structure of Memory Pillar MP and Memory Cell Transistor MT

1-6-1. First Example

Figure 8:
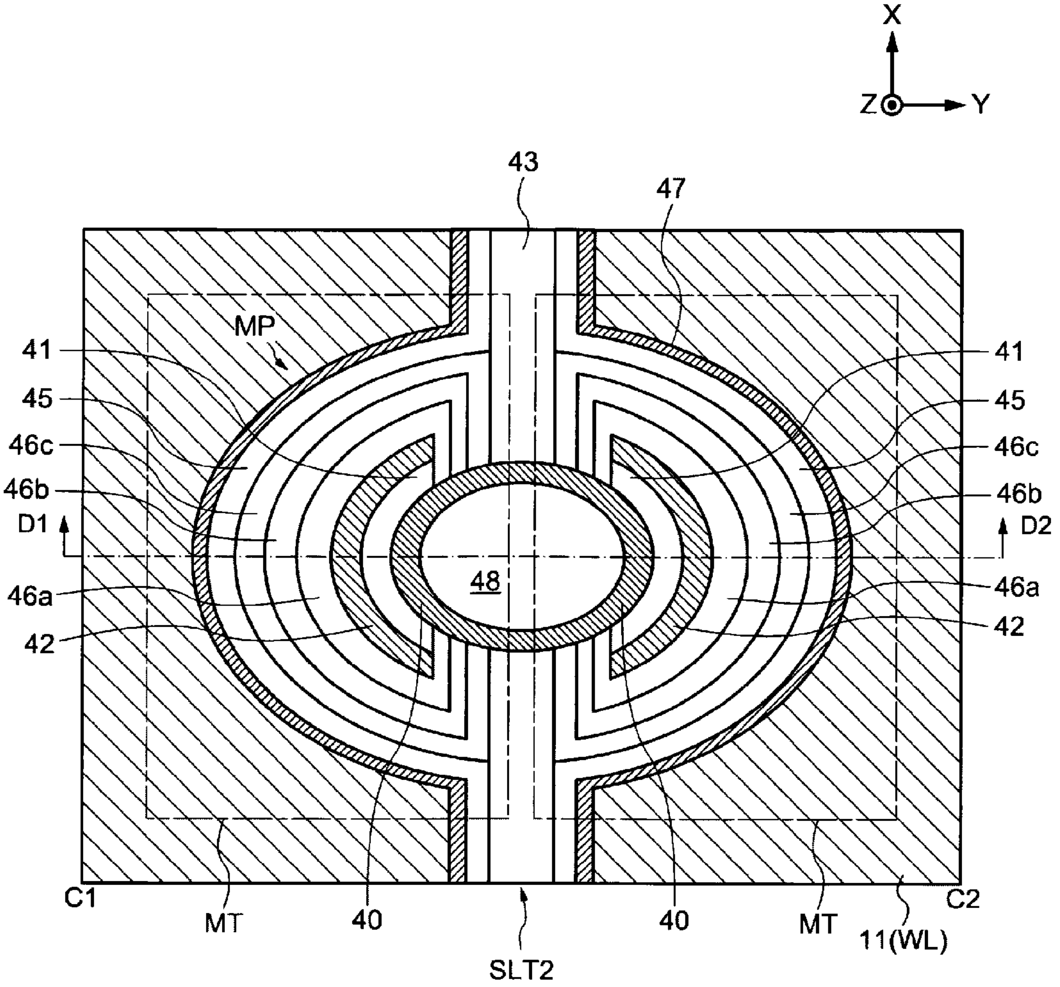
FIG. 8 is a sectional view taken along line C1-C2 of a memory cell transistor shown in FIG. 5 in a first example.
Figure 9:
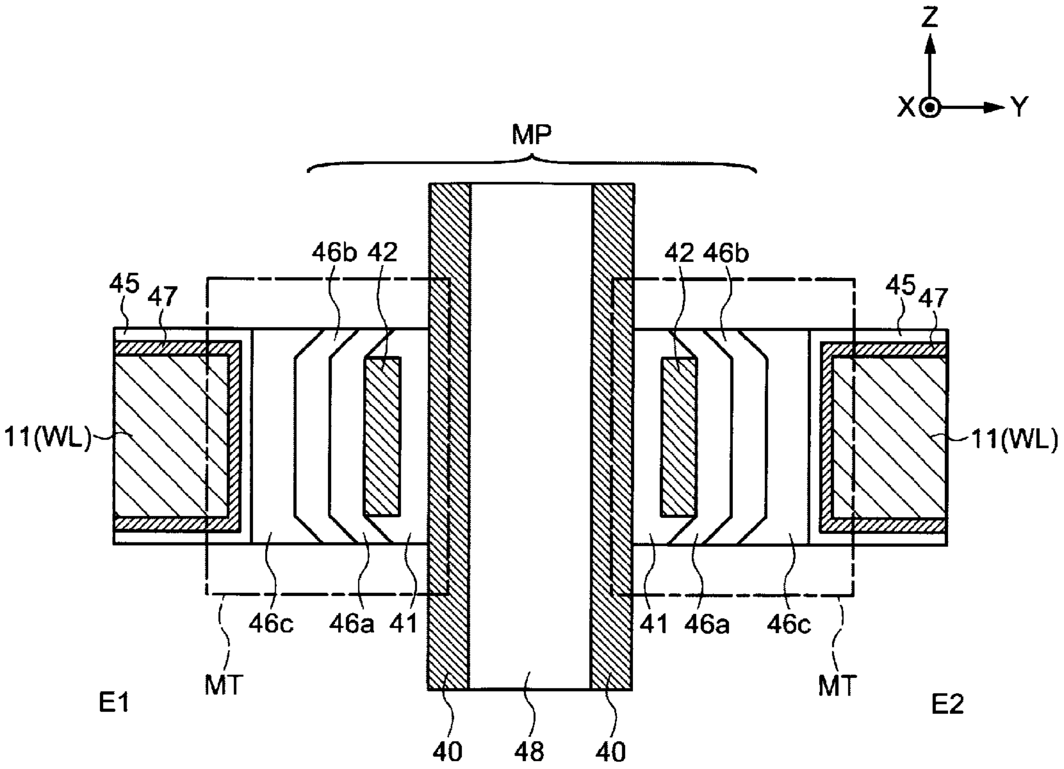
FIG. 9 is a sectional view taken along line D1-D2 of the memory cell transistor shown in FIG. 8.

In the structure of the memory cell transistor MT according to the first embodiment, the structure of the first example shown in FIGS. 8 and 9 is used. FIG. 8 is a view showing a sectional end face taken along line C1-C2 of FIG. 5, and FIG. 9 is a view showing a sectional end face taken along line D1-D2 of the memory cell transistor MT shown in FIG. 8. FIG. 8 and FIG. 9 are sectional end face views showing a region including two memory cell transistors MT. In the first example, the charge storage layer provided in the memory cell transistor MT is a conductive film. In the first example, the memory cell transistor MT is a floating gate type memory cell transistor MT. The structure of the memory cell transistor MT shown in the first example is not limited to the structures shown in FIGS. 8 and 9. In the description of FIGS. 8 and 9, the description of the same or similar configurations as those in FIGS. 1 to 7 may be omitted.

As shown in FIGS. 8 and 9, the memory pillar MP includes the insulating layer 48, the insulating layer 43, the semiconductor layer 40, the insulating layer 41, the conductive layer 42, and the insulating layers 46*a* to 46*c* provided along the Z direction. The insulating layer 48 is formed of, for example, a silicon oxide film. The semiconductor layer 40 surrounds the insulating layer 48. The semiconductor layer 40 functions as a region where the channel of the memory cell transistor MT is formed. The semiconductor layer 40 is formed of, for example, a polycrystalline silicon layer. The semiconductor layer 40 is continuously provided between the memory cell transistors MT in the same memory pillar MP and is not separated between the memory cell transistors MT. Therefore, the channels formed in the two memory cell transistors MT share a part of the memory pillar MP.

The semiconductor layer 40 is continuous between the two memory cell transistors MT facing each other. Therefore, the channels formed in the two memory cell transistors MT facing each other share a part of the memory pillar MP. Specifically, in FIGS. 8 and 9, the channel formed in the first memory cell (left memory cell transistor MT depicted in FIG. 8) and the channel formed in the second memory cell (right memory cell transistor MT depicted in FIG. 8) share a part of the memory pillar MP. Here, the fact that the two channels share a part of the memory pillar MP means that the two channels are formed in the same memory pillar MP and the two channels partially overlap each other.

The insulating layer 41 is provided around the semiconductor layer 40 and functions as a gate insulating film of each memory cell transistor MT. The insulating layer 41 is separated into two regions in the XY plane shown in FIG. 8. Each of the insulating layers 41 separated into two regions functions as a gate insulating film of the two memory cell transistors MT in the same memory pillar MP. The insulating layer 41 is formed using, for example, a stacked structure of a silicon oxide film and a silicon nitride film.

The conductive layer 42 is provided around the insulating layer 41 and is separated into two regions along the Y direction by the insulating layer 43. Each of the conductive layers 42 separated into two regions functions as a charge storage layer of each of the two memory cell transistors MT. The conductive layer 42 is formed of, for example, a polycrystalline silicon layer.

The insulating layer 43 is formed of, for example, a silicon oxide film. An insulating layer 46*a*, an insulating layer 46*b*, and an insulating layer 46*c* are subsequently provided around the conductive layer 42 from the side close to the conductive layer 42. The insulating layer 46*a* and the insulating layer 46*c* are formed of, for example, a silicon oxide film, and the insulating layer 46*b* is formed of, for example, a silicon nitride film. The insulating layer 46*a*, the insulating layer 46*b*, and the insulating layer 46*c* function as block insulating films of the memory cell transistor MT. The insulating layer 46*a*, the insulating layer 46*b*, and the insulating layer 46*c* are separated into two regions along the Y direction. The insulating layer 43 is provided between the insulating layers 46*c* separated into two regions. In addition, the insulating layer 43 is embedded in the slit SLT2 excluding the memory pillar MP section and in the slit SLT1 excluding the dummy pillar DP section. The insulating layer 43 is formed of, for example, a silicon oxide film.

For example, an AlO layer 45 is provided around the first example of the memory pillar MP according to the first embodiment. For example, a barrier metal layer 47 is provided around the AlO layer 45. The barrier metal layer 47 is formed of, for example, a TiN film. A wiring layer 11 functioning as a word line WL is provided around the barrier metal layer 47. The wiring layer 11 of the memory pillar MP according to the first embodiment is formed using, for example, a film made of tungsten as a material.

In the configuration of the memory cell transistor MT shown in FIGS. 8 and 9, two memory cell transistors MT are provided in one memory pillar MP along the Y direction. The select transistors ST1 and ST2 have the same configuration as the memory cell transistor MT. An insulating layer (not shown) is provided between the memory cell transistors MT adjacent to each other in the Z direction, and the conductive layer 42 is insulated by such insulating layer, the insulating layer 43, and the insulating layer 46 for each individual memory cell transistor MT.

1-6-2. Second Example

Figure 10:
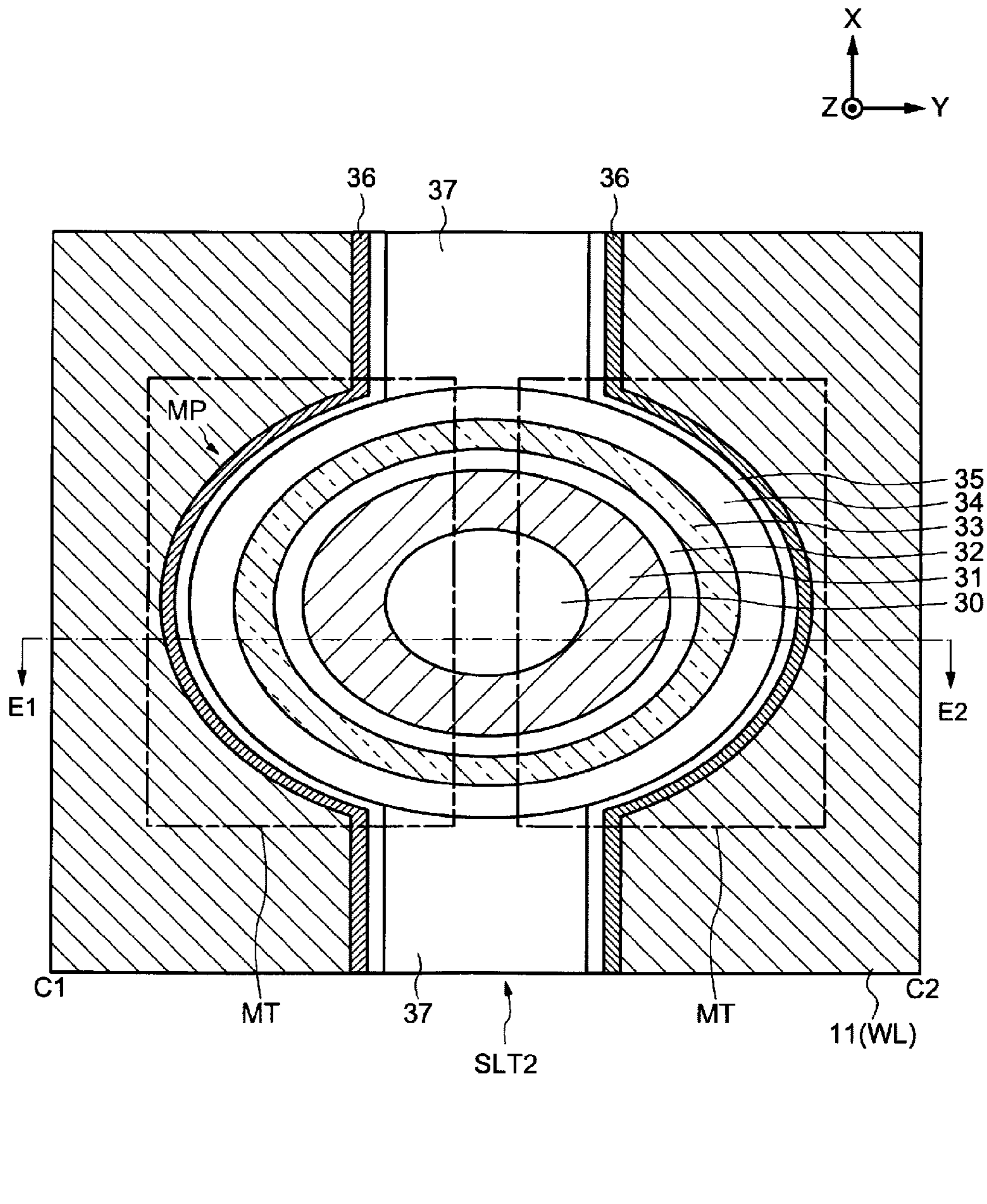
FIG. 10 is a sectional view taken along line C1-C2 of the memory cell transistor shown in FIG. 5 in a second example.
Figure 11:
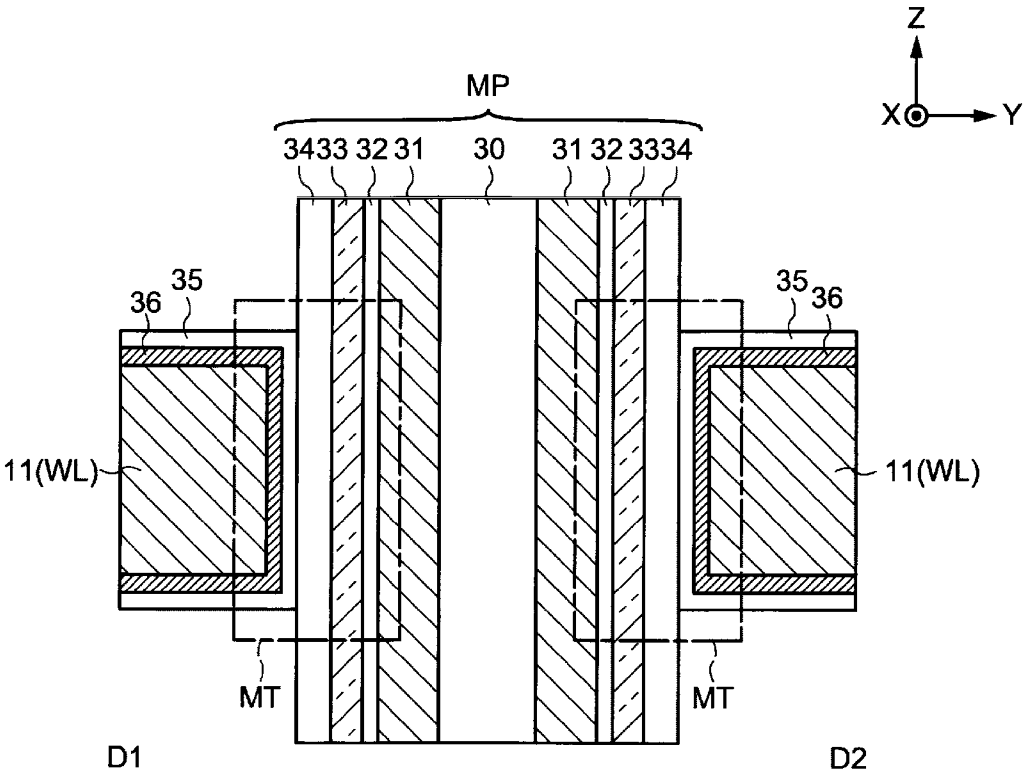
FIG. 11 is a sectional view taken along line E1-E2 of the memory cell transistor shown in FIG. 10.

In the memory cell transistor MT according to the first embodiment, a structure of a second example shown in FIGS. 10 and 11 may be used. FIG. 10 is a view showing a sectional end face taken along line C1-C2 of FIG. 5, and FIG. 11 is a view showing an E1-E2 cut sectional end face of the memory cell transistor MT shown in FIG. 10. FIG. 10 and FIG. 11 are sectional end face views showing a region including two memory cell transistors MT. In the second example, the charge storage layer provided in the memory cell transistor MT is an insulating film. In the second example, the memory cell transistor MT is a MONOS-type memory cell transistor MT. The structure of the memory cell transistor MT shown in the second example is not limited to the structures shown in FIGS. 10 and 11. In the description of FIGS. 10 and 11, the description of the same or similar configurations as those in FIGS. 1 to 7 may be omitted.

As shown in FIGS. 10 and 11, the memory pillar MP includes an insulating layer 30, a semiconductor layer 31, an insulating layer 32, an insulating layer 33, and an insulating layer 34 provided along the Z direction. The insulating layer 30 is formed of, for example, a silicon oxide film. The semiconductor layer 31 surrounds the insulating layer 30 and functions as a region where the channel of the memory cell transistor MT is formed. The semiconductor layer 31 is formed of, for example, a polycrystalline silicon layer. The semiconductor layer 31 is not separated between the memory cell transistors MT in the same memory pillar MP, and is continuously provided. Therefore, the channels formed in the two memory cell transistors MT share a part of the memory pillar MP.

The insulating layer 32 surrounds the semiconductor layer 31 and functions as a gate insulating film of the memory cell transistor MT. The insulating layer 32 is formed using, for example, a stacked structure of a silicon oxide film and a silicon nitride film. The insulating layer 33 surrounds the semiconductor layer 31 and functions as a charge storage layer of the memory cell transistor MT. The insulating layer 33 is formed of, for example, a silicon nitride film. The insulating layer 34 surrounds the insulating layer 33 and functions as a block insulating film of the memory cell transistor MT. The insulating layer 34 is formed of, for example, a silicon oxide film. The insulating layer 37 is embedded in the slit SLT2 excluding the memory pillar MP section and in the slit SLT1 excluding the dummy pillar DP section. The insulating layer 37 is formed of, for example, a silicon oxide film.

For example, an AlO layer 35 is provided around the memory pillar MP according to the second example. For example, a barrier metal layer 36 is provided around the AlO layer 35. The barrier metal layer 36 is formed of, for example, a TiN film. A wiring layer 11 functioning as a word line WL is provided around the barrier metal layer 36. The wiring layer 11 is formed using, for example, a film made of tungsten as a material.

Similar to the first example, one memory pillar MP according to the second example includes two memory cell transistors MT along the Y direction. Similarly, the one memory pillar MP includes two select transistors ST1 and two select transistors ST2 along the Y direction.

1-7. Equivalent Circuit of String

Figure 12:
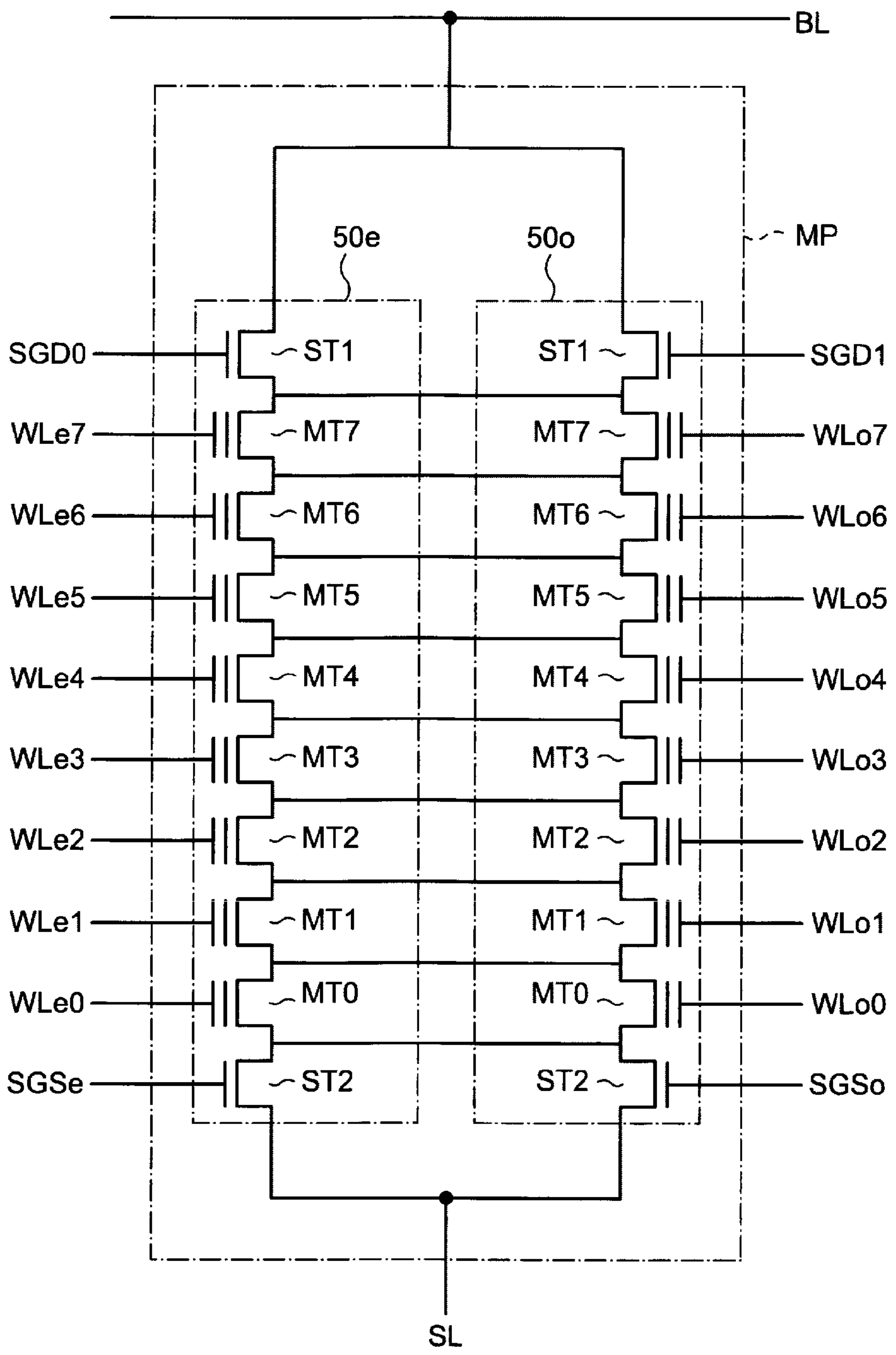
FIG. 12 is a diagram showing an equivalent circuit of adjacent memory strings in the semiconductor memory device according to the first embodiment.

FIG. 12 is an equivalent circuit diagram of adjacent strings in the semiconductor memory device 1 according to the first embodiment. The equivalent circuit diagram of the string according to the first embodiment is not limited to the equivalent circuit diagram shown in FIG. 12. In the description of FIG. 12, the description of the same or similar configurations as those in FIGS. 1 to 11 may be omitted.

As shown in FIG. 12, two memory strings 50*e* and 50*o* are formed in one memory pillar MP. Each of the memory strings 50*e* and 50*o* has the select transistor ST1, the memory cell transistors MT0 to MT7, and the select transistor ST2 that are electrically connected in series. The memory string 50*e* and the memory string 50*o* face each other. Therefore, the select transistor ST1, the memory cell transistors MT0 to MT7, and the select transistor ST2 provided in the memory string 50*e* respectively face the select transistor ST1, the memory cell transistors MT0 to MT7, and the select transistor ST2 provided in the memory string 50*o* in a one-to-one manner. Specifically, the select transistor ST1 provided in the memory string 50*e* and the select transistor ST1 provided in the memory string 50*o* faces each other, the memory cell transistors MT0 to MT7 provided in the memory string 50*e* and the memory cell transistors MT0 to MT7 provided in the memory string 50*o* respectively face each other in a one-to-one manner, and the select transistor ST2 provided in the memory string 50*e* and the select transistor ST2 provided in the memory string 50*o* face each other.

In the following description, mainly, an example including two memory pillars MP, that is, a first memory pillar MP (for example, MP4 in FIG. 4) and a second memory pillar MP (for example, MP0 in FIG. 4) adjacent to the first memory pillar MP will be described. The first memory pillar MP may be referred to as a "first semiconductor pillar", the memory string 50*e* provided in the first memory pillar MP may be referred to as a "first string", the memory cell transistors MT0 to MT7 provided in the first string may be referred to as a "first memory cell", the side on which the first string is provided may be referred to as a "first side", the memory string 50*o* provided in the first memory pillar MP may be referred to as a "second string", the memory cell transistors MT0 to MT7 provided in the second string may be referred to as a "second memory cell", and the side on which the second string is provided may be referred to as a "second side". Similar to the first memory pillar MP, the second memory pillar MP may be referred to as a "second semiconductor pillar", the memory string 50*e* provided in the second memory pillar MP may be referred to as a "third string", the memory cell transistors MT0 to MT7 provided in the third string may be referred to as a "third memory cell", the side on which the third string is provided may be referred to as a "first side", the memory string 50*o* provided in the third memory pillar MP may be referred to as a "fourth string", the memory cell transistor MT0 provided in the fourth string may be referred to as a "fourth memory cell", and the side on which the fourth string is provided may be referred to as a "second side". The second side is an opposite side of the first side with respect to the memory pillar MP.

The select transistors ST1 of the memory strings 50*e* provided in the first memory pillar MP and the second memory pillar MP are connected to, for example, respective common select gate lines SGD0. The select transistors ST1 of the memory strings 50*o* provided in the first memory pillar MP and the second memory pillar MP are connected to, for example, respective common select gate lines SGD1. The memory cell transistors MT0 to MT7 of the memory strings 50*e* provided in the first memory pillar MP and the second memory pillar MP are connected to respective common word lines WLe0 to WLe7. The memory cell transistors MT0 to MT7 of the memory strings 50*o* provided in the first memory pillar MP and the second memory pillar MP are connected to respective common word lines WLo0 to WLo7. The select transistors ST2 of the memory strings 50*e* provided in the first memory pillar MP and the second memory pillar MP are connected to, for example, respective common even select gate lines SGSe. The select transistors ST2 of the memory strings 50*o* provided in the first memory pillar MP and the second memory pillar MP are connected to, for example, respective common odd select gate lines SGSo.

The common word lines WLe0 to WLe7 connected to the memory cell transistors MT0 to MT7 provided in the memory strings 50*e* provided in the first memory pillar MP and the second memory pillar MP may be referred to as "first word lines", and the word lines WLo0 to WLo7 connected to the memory cell transistors MT0 to MT7 provided in the memory strings 50*o* provided in the first memory pillar MP and the second memory pillar MP may be referred to as "second word lines".

In the memory strings 50*e* and 50*o,* the sources and the drains of the select transistors ST1 facing each other are electrically connected, the sources and the drains of the memory cell transistors MT0 to MT7 facing each other are electrically connected, and the sources and the drains of the select transistors ST2 facing each other are electrically connected. The electrical connections described above are due to the fact that the channels formed in the facing transistors shares a part of the memory pillar MP.

The two memory strings 50*e* and 50*o* in the same memory pillar MP are connected to the same bit line BL and the same source line SL.

2. Operation Example

2-1. Overview of Write Operation and Read Operation

A manner in which the select gate line SGD is selected will be described with reference to FIGS. 3 and 4. When any of the select gate lines SGD0 to SGD3 is selected, a voltage for setting the select transistor ST1 into an ON state is supplied to one wiring layer, 10-0 to 10-3, corresponding to each select gate line. For example, when the wiring layer 10-1 is selected, the eight select transistors ST1 provided in the memory pillars MP0, MP1, MP4, MP5, MP8, MP9, MP12, and MP13 enter an ON state. Accordingly, the memory cell transistor MT belonging to the memory pillar corresponding to the select gate line SGD1 is selected in the block BLK. The memory group MG is formed by the memory cell transistors MT selected by each select gate line. In addition, one page is formed by the memory cell transistors MT corresponding to the word lines WL selected from the memory group MG. The operation when any wiring layer other than the wiring layer 10-1 is selected is the same as that described above, and thus the description thereof will be omitted. Therefore, the block BLK includes the memory groups MG corresponding to the number of select gate lines SGD, and each memory group MG includes the page corresponding to the number of word lines WL.

As a write method of the memory cell transistor MT, for example, a TLC method is applicable. The plurality of memory cell transistors MT to which the TLC method is applied form eight threshold voltage distributions (referred to herein as write states). The eight threshold voltage distributions are referred to as, for example, in order of increasing threshold voltages, an "eR" state, an "A" state, a "B"

state, a “C” state, a “D” state, an “E” state, an “F” state, and a “G” state. Different 3-bit data are assigned to the “eR” state, the “A” state, the “B” state, the “C” state, the “D” state, the “E” state, the “F” state, and the “G” state.

The semiconductor memory device 1 repeatedly executes the program loop in the write operation. The program loop includes, for example, a program operation and a verification operation. The program operation is an operation of increasing the threshold voltage of the selected memory cell transistor MT by injecting electrons into the charge storage layer of the selected memory cell transistor MT. Alternatively, the program operation is an operation of maintaining the threshold voltage of the selected memory cell transistor MT by protecting against the injection of electrons into the charge storage layer. The verification operation is an operation of verifying whether the threshold voltage of the selected memory cell transistor MT has reached the target state by an operation of reading out using the verify voltage following the program operation. The selected memory cell transistor MT whose threshold voltage has reached the target state is then write inhibited.

In the semiconductor memory device 1, the program loop including the program operation and the verification operation as described above is repeatedly executed, so that the threshold voltage of the selected memory cell transistor MT is increased to the target state.

The electrons stored in the charge storage layer may be stored in an unstable state. Therefore, from the time when the above-described program operation is completed, the electrons stored in the charge storage layer of the memory cell transistor MT may escape from the charge storage layer over time. When the electrons escape from the charge storage layer, the threshold voltage of the memory cell transistor MT decreases. Therefore, in the read operation that is executed after the completion of the write operation, the read operation is performed using a read voltage lower than the verify voltage in order to cope with the decrease in the threshold voltage of the memory cell transistor that may occur over time.

2-2. Example of Write Operation

Figure 13:
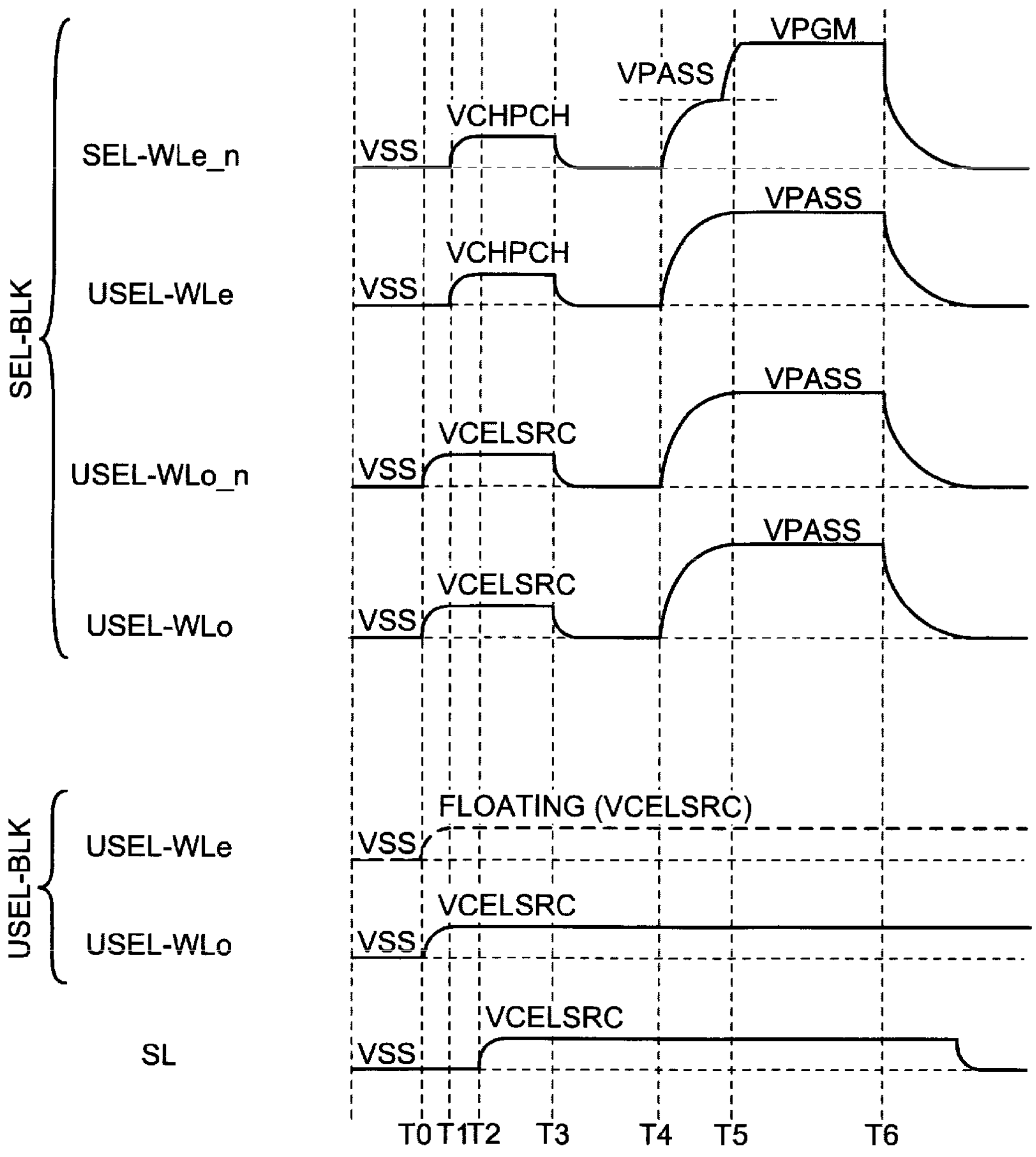
FIG. 13 is a diagram showing a timing chart of various signals during a data write operation of the semiconductor memory device according to the first embodiment.
Figure 14:
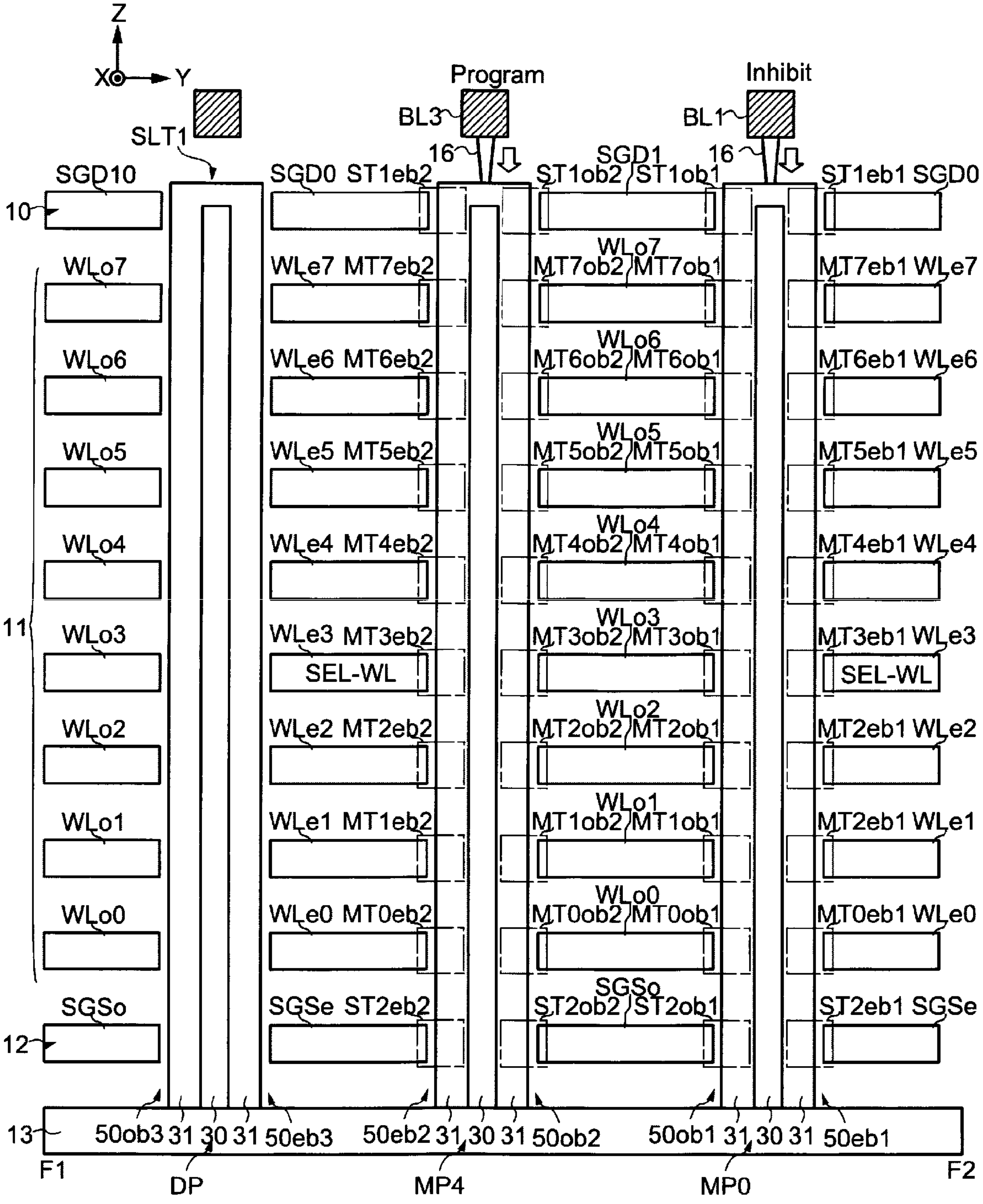
FIG. 14 is a sectional end face view of the semiconductor memory device showing the write operation of the semiconductor memory device according to the first embodiment.

FIG. 13 is a diagram showing a timing chart of various signals during a data write operation of the semiconductor memory device 1 according to the first embodiment, and FIG. 14 is a sectional end face view of the semiconductor memory device 1 showing the data write operation of the semiconductor memory device 1 according to the first embodiment. The timing chart of the semiconductor memory device 1 according to the first embodiment and the configuration of the timing chart are not limited to the timing chart and the configuration according to the timing chart shown in FIGS. 13 and 14. In the description of FIGS. 13 and 14, the description of the same or similar configurations as those in FIGS. 1 to 12 may be omitted.

The sectional end face view shown in FIG. 14 is a view showing the outline of the structure of the F1-F2 cut sectional end face of the semiconductor memory device 1 shown in FIG. 4. In addition, the structure of the sectional end face of the memory cell transistor MT and the select transistor ST shown in FIG. 14 is a structure schematically showing the sectional end face of the memory cell transistor shown in FIG. 11, and in the structure of the sectional end face of the memory cell transistor MT and the select transistor ST shown in FIG. 14, elements other than the word line WL, the semiconductor layer 31, and the insulating layer 30 are omitted.

In the following description, an example will be given to describe when the memory cell transistor MT belonging to the memory group MG (page) to be operated faces the even word line WLe. In this case, the even word line WLe is referred to as a selected word line, and the odd word line WLo is referred to as a non-selected word line. For example, a word line corresponding to the memory group MG to be operated is referred to as a selected even word line SEL-WLe_n, and the rest of word lines in the same block BLK are referred to as even word lines USEL-WLe other than the selected even word line SEL-WLe_n or odd word lines WLo. For example, the bit line BL electrically connected to the memory string including the selected memory cell transistor MT (memory cell transistor MT to which data is written) in the memory group MG (page) to be operated is referred to a bit line ProgramBL, and the bit line BL electrically connected to the memory string including the memory cell transistor MT (memory cell transistor MT to which data is not written) other than the selected memory cell transistor MT in the memory group MG (page) to be operated is referred to as a bit line InhibitBL.

In addition, in the following description, for example, a configuration having a sectional end face view of the semiconductor memory device 1 shown in FIG. 14 will be described as an example.

For example, as shown in FIG. 14, in the sectional end face view (cross-sectional view), the semiconductor memory device 1 has a dummy pillar DP disposed in the slit SLT1 between the block BLK0 and the block BLK1, and two memory pillars MP of the memory pillar MP4 and the memory pillar MP0 in the block BLK1. The memory pillar MP4 has a memory string 50*eb*2 and a memory string 50*ob*2, and the memory pillar MP0 has a memory string 50*eb*1 and a memory string 50*ob*1. The dummy pillar DP has a dummy string 50*eb*3 and a dummy string 50*ob*3.

The memory string 50*eb*2 and the memory string 50*ob*2 are electrically connected to the same bit line BL3 using the contact plug 16, and the memory string 50*eb*1 and the memory string 50*ob*1 are electrically connected to the same bit line BL1 using the contact plug 16. The dummy string 50*eb*3 and the dummy string 50*ob*3 are not connected to the bit line BL. The memory string 50*eb*2, the memory string 50*ob*2, the memory string 50*eb*1, and the memory string 50*ob*1 are electrically connected to the same source line SL. The dummy string 50*eb*3 and the dummy string 50*ob*3 are connected to the same source lines SL as the memory string 50*eb*2, the memory string 50*ob*2, the memory string 50*eb*1, and the memory string 50*ob*1.

The memory string 50*eb*2 includes a select transistor ST2*eb*2, memory cell transistors MT0*eb*2 to MT7*eb*2, and a select transistor ST1*eb*2. The memory string 50*ob*2 includes a select transistor ST2*ob*2, memory cell transistors MT0*ob*2 to MT7*ob*2, and a select transistor ST0*ob*2. The memory string 50*eb*1 includes a select transistor ST2*eb*1, memory cell transistors MT0*eb*1 to MT7*eb*1, and a select transistor ST1*eb*1. The memory string 50*ob*1 includes a select transistor ST2*ob*1, memory cell transistors MT0*ob*1 to MT7*ob*1, and a select transistor ST1*ob*1.

The select transistor ST1*eb*2 of the memory string 50*eb*2 and the select transistor ST1eb1 of the memory string 50*eb*1 are electrically connected to, for example, a common select gate line SGD0 (selected even select gate line SEL-SGDe). The select transistor ST1*ob*2 of the memory string 50*ob*2 and the select transistor ST1*ob*1 of the memory string 50*ob*1 are electrically connected to, for example, a common select gate line SGD1 (odd select gate line SGDo facing the selected even select gate line SEL-SGDe).

Each of the memory cell transistors MT0*eb*2 to MT7*eb*2 and each of the memory cell transistors MT0*eb*1 to MT7*eb*1 are electrically connected to the respective common word lines WLe0 to WLe7. Each of the memory cell transistors MT0*ob*2 to MT7*ob*2 and each of the memory cell transistors MT0*ob*1 to MT7*ob*1 are electrically connected to the respective common word lines WLo0 to WLo7. For example, the memory cell transistor MT2*eb*2 and the memory cell transistor MT2*eb*1 are electrically connected to a common word line WLe2, the memory cell transistor MT5*eb*2 and the memory cell transistor MT5*eb*1 are electrically connected to a common word line WLe5, the memory cell transistor MT3*ob*2 and the memory cell transistor MT3*ob*1 are electrically connected to a common word line WLo3, and the memory cell transistor MT6*ob*2 and the memory cell transistor MT6*ob*1 are electrically connected to a common word line WLo6.

The select transistor ST2*eb*2 of the memory string 50*eb*2 and the select transistor ST2*eb*1 of the memory string 50*eb*1 are electrically connected to, for example, a common select gate line SGS (even select gate line SGSe or selected select gate line SEL-SGS). The select transistor ST2*ob*2 of the memory string 50*ob*2 and the select transistor ST2*ob*1 of the memory string 50*ob*1 are electrically connected to, for example, a common select gate line SGS (odd select gate line SGS or selected select gate line SEL-SGS).

The dummy string 50*eb*3 is connected to, for example, the common select gate line SGD0 (selected even select gate line SEL-SGDe), common word lines WLe0 to WLe7, and common select gate line SGS (even select gate line SGSe or selected select gate line SEL-SGS), shared with the memory string 50*eb*2 and the memory string 50*eb*1. The dummy string 50*ob*3 is connected to, for example, the common select gate line SGD10 (odd select gate line SGDo), the common word lines WLo0 to WLo7, and the common select gate line SGS (odd select gate line SGSo) in the block BLK0.

In addition, in FIG. 14, the selected block SEL-BLK is BLK1, the selected even select gate line SEL-SGDe is the select gate line SGD0, the odd select gate SGDo facing the selected even select gate line SEL-SGDe is the select gate line SGD1, the selected even word line SEL-WLe_n is the selected word line WLe3 (n=3), the non-selected even word lines USEL-WLe are the word lines WLe0 to WLe2 and WLe4 to WLe7, the odd word lines WLo0 to WLo7, and the bit line InhibitBL is the bit line BL1, the bit line ProgramBL is the bit line BL3, the selected select gate line SEL-SGS is the select gate line SGSe, and the non-selected select gate USEL-SGS is the select gate line SGSo.

In the description of the write operation according to the present embodiment, the write operation for writing desired data into the memory cell transistor MT3*eb*2 electrically connected to the selected even word line SEL-WLe_n (selected word line WLe3 (n =3)) will be described.

In the first embodiment, as described above, for example, the memory controller 2 transmits a signal for instructing a write operation of data to the semiconductor memory device 1 using the write protect signal WPn. When the semiconductor memory device 1 receives the write protect signal WPn, the sequencer 24 provided in the semiconductor memory device 1 controls the sense amplifier module 70, the row decoder 29, the voltage generation circuit 27, the driver set 28, and the like based on the command for instructing the write operation of the data provided in the write protect signal WPn, and causes the write operation to be executed. For example, the supply of the voltage to the word line WL, the select gate line SGD, the select gate line SGS, the source line SL, and the like is executed through control of the voltage generation circuit 27, the driver set 28, and the row decoder 29 using the sequencer 24. In addition, the supply of the voltage to the bit line BL is executed through control of the voltage generation circuit 27, the driver set 28, and the sense amplifier module 70 using the sequencer 24.

2-2-1. Example of Write Operation up to Time T0

The write operation up to the time T0 will be described with reference to FIG. 13. The write operation up to the time T0 is, for example, an operation of setting the state of the semiconductor memory device 1 to a standby state. The standby state is, for example, a state where the device awaits data to be written. As shown in FIG. 13, up to the time T0, the voltage VSS is supplied to the selected even word line SEL-WLe_n, the non-selected even word lines USEL-WLe other than the selected even word line SEL-WLe_n, the non-selected odd word lines USEL-WLo_n facing the selected even word lines SEL-WLe_n, and the non-selected odd word lines USEL-WLo other than the non-selected odd word lines USEL-WLo_n, of the selected block SEL-BLK, as well as the non-selected even word lines USEL-WLE and the non-selected odd word lines USEL-WLo, of the non-selected block USEL-BLK, and the source line SL. In the first embodiment, the voltage VSS is, for example, a voltage for which other voltages can be defined with reference to the voltage VSS, may be referred to as a reference voltage, may be 0 V, or may be ground.

The voltage VSS is supplied to the selected even word line WLe3, the non-selected even word lines WLe0 to WLe2 and WLe4 to WLe7, and the non-selected odd word lines WLo0 to WLo7, of the selected block BLK1, as well as the non-selected even word lines WLe0 to WLe7 and the non-selected odd word lines WLo0 to WLo7, of the non-selected blocks (such as the non-selected block BLK0 and the non-selected block BLK2) other than the selected block BLK1, and the source line SL. Each memory cell transistor MT is in an OFF state.

2-2-2. Example of Write Operation at Time T1

The write operation at the time T0 to T1 will be described with reference to FIG. 13. The write operation at the time T0 to T1 is, for example, an operation of supplying the voltage VCELSRC (first voltage) to the non-selected odd word lines USEL-WLo. In other words, the write operation at the time T0 to T1 is an operation of supplying the voltage VCELSRC to the non-selected odd word lines USEL-WLo_n and the non-selected odd word line USEL-WLo other than the non-selected odd word lines USEL-WLo_n (non-selected odd word lines WLo0 to WLo7), of the selected block SEL-BLK, as well as the non-selected odd word lines USEL-WLo (non-selected odd word lines WLo0 to WLo7) of the non-selected block USEL-BLK. The voltage VSS is supplied to the selected even word line SEL-WLe_n and the non-selected even word lines USEL-WLe other than the selected even word line SEL-WLe_n, of the selected block SEL-BLK. As shown in FIG. 13, at the time T0 to T1 of the write operation according to the first embodiment, the non-selected even word lines USEL-WLe of the non-selected block USEL-BLK facing the non-selected odd word lines USEL-WLo to which the voltage VCELSRC is supplied can be boosted to the voltage VCELSRC through the capacitive coupling with the non-selected odd word lines USEL-WLo.

2-2-3. Example of Write Operation at Time T2

As shown in FIG. 13, at the time T1 to T2, the voltage VCHPCH (second voltage) from the voltage VSS is supplied to the selected even word line SEL-WLe_n and the non-selected even word lines USEL-WLe other than the selected even word line SEL-WLe_n, of the selected block SEL-BLK. The non-selected odd word lines USEL-WLo are continuously supplied with the voltage VCELSRC. The non-selected even word lines USEL-WLe of the non-selected block USEL-BLK facing the non-selected odd word lines USEL-WLo store the voltage VCELSRC in a floating state. The numerical value n is a positive integer, and is, for example, 3. For example, when the numerical value n is 3, the selected even word line SEL-WLe_n is the even word line SEL-WLe3. The even word line SEL-WLe3 is a third even word line SEL-WLe3 among the plurality of even word lines SEL-WLe. The odd word line WLo_n (WLo_n) has the same configuration as the even word line WLe_n (WLe_n) described above.

In the first embodiment, the voltage VCHPCH (second voltage) is higher than the voltage VSS (for example, 0 V, reference voltage), and the voltage VCELSRC (first voltage) is higher than the voltage VSS (for example, 0 V, reference voltage). In addition, the voltage VCHPCH (second voltage) is lower than the voltage state at which a threshold voltage of "A" state or higher is read.

Figure 15:
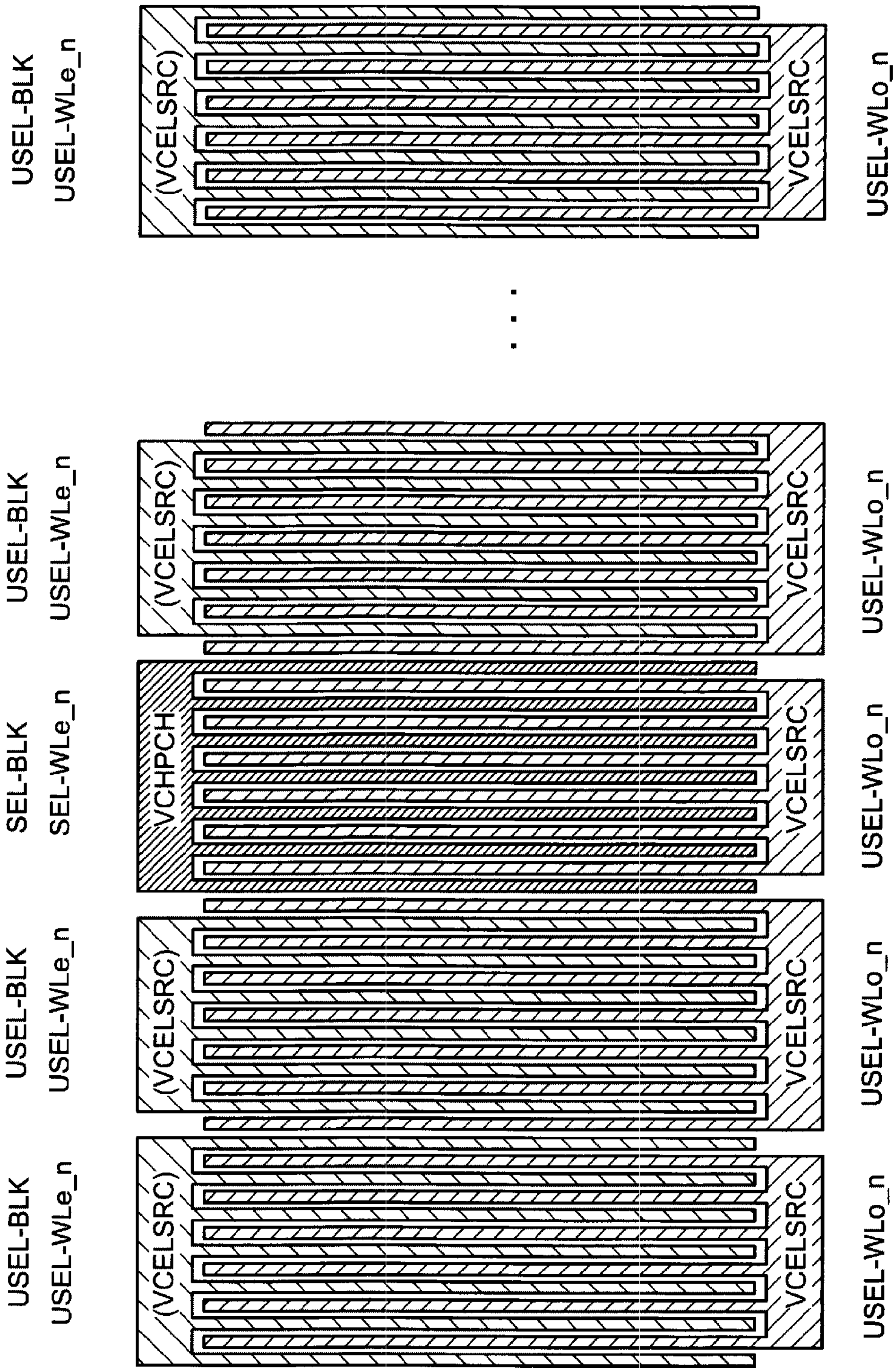
FIG. 15 is a diagram showing voltages supplied to various signal lines at time T1 and time T2 of the timing chart shown in FIG. 13.

The write operation at the time T1 and the write operation at the time T2 may be performed at the same time. FIG. 15 is a diagram showing voltages supplied to various signal lines at the time T1 and the time T2 of the timing chart shown in FIG. 13. The voltage VCELSRC (first voltage) is supplied to the non-selected odd word lines USEL-WLo (write operation at time T1), and the voltage VCHPCH (second voltage) is supplied to the selected even word line SEL-WLe_n and the non-selected even word lines USEL-WLe other than the selected even word line SEL-WLe_n, of the selected block SEL-BLK (write operation at time T2). The non-selected even word lines USEL-WLe of the non-selected block USEL-BLK facing the non-selected odd word lines USEL-WLo can be boosted to the voltage VCELSRC through the capacitive coupling with the non-selected odd word lines USEL-WLo. That is, by simultaneously supplying different voltages to the even word line WLe and the odd word line WLo, it is possible to achieve a more efficient operation and to shorten the program time.

2-2-4. Example of Write Operation at Time T3

The write operation at the time T2 to T3 will be described with reference to FIG. 13. The write operation at the time T2 to T3 is an operation of precharging the channel of the memory cell transistor MT by supplying the source line SL with the voltage VCELSRC. The timing at which the voltage VCELSRC is supplied to the source line SL is later than the timing at which the voltage VCHPCH is supplied to the selected even word line SEL-WLe_n and the non-selected even word lines USEL-WLe other than the selected even word line SEL-WLe_n, of the selected block SEL-BLK. At the time T2 to T3, the voltage VCHPCH is supplied to the selected even word line SEL-WLe_n and the non-selected even word lines USEL-WLe other than the selected even word line SEL-WLe_n, of the selected block SEL-BLK, the voltage VCELSRC is supplied to the odd word lines WLo0 to WLo7, and the voltage VCELSRC (third voltage) from the voltage VSS is supplied to the source line SL. Accordingly, for example, the voltage VCELSRC is supplied to the channel (semiconductor layer 31 or 40 functioning as the channel) of each memory cell transistor MT.

At the time T3 to T4, as shown in FIG. 13, the voltage VSS from the voltage VCHPCH is supplied to the selected even word line SEL-WLe_n and the non-selected even word lines USEL-WLe other than the selected even word line SEL-WLe_n, of the selected block SEL-BLK, the voltage VSS from the voltage VSELSRC is supplied to the non-selected odd word lines USEL-WLo_n and the non-selected odd word lines USEL-WLo other than the non-selected odd word lines USEL-WLo_n, the voltage VCELSRC is supplied to the non-selected odd word lines USEL-WLo of the non-selected block USEL-BLK, and the voltage VCELSRC is supplied to the source line SL. The non-selected even word lines USEL-WLe of the non-selected block USEL-BLK store the voltage VCELSRC in a floating state.

2-2-5. Example of Write Operation at Time T4

The write operation at the time T4 to T5 will be described with reference to FIG. 13. The write operation at the time T4 to T5 is, for example, an operation of supplying the voltage VPASS to the word line WL of the selected block SEL-BLK to boost the channel of the memory cell transistor MT which is non-writable. As shown in FIG. 13, at the time T4 to T5, the voltage VPASS (fourth voltage) from the voltage VSS is supplied to the selected even word line SEL-WLe_n, the non-selected even word lines USEL-WLe other than the selected even word line SEL-WLe_n, the non-selected odd word lines USEL-WLo_n, and the non-selected odd word lines USEL-WLo other than the non-selected odd word lines USEL-WLo_n, of the selected block SEL-BLK, the voltage VCELSRC is supplied to the non-selected odd word lines USEL-WLo of the non-selected block USEL-BLK, and the voltage VCELSRC is supplied to the source line SL. The non-selected even word lines USEL-WLe of the non-selected block USEL-BLK store the voltage VCELSRC in a floating state.

In the first embodiment, the voltage VPASS (fourth voltage) is higher than the voltage VCELSRC (first voltage), and the voltage VPASS (fourth voltage) is higher than the voltage VCHPCH (second voltage).

At the time T4 to T5, the select transistor ST1 provided in the memory string 50 connected to the bit line ProgramBL enters an ON state, and the select transistor ST1 provided in the memory string 50 connected to the bit line InhibitBL enters an OFF state. This results in the electrical disconnection between the bit line InhibitBL and the channel. The channel is boosted due to capacitive coupling with the non-selected even word lines USEL-WLe and the odd word lines WLo0 to WLo7. That is, each of the channels (third channels) of the memory cell transistors MT0*eb*1 to MT7*eb*1 (third memory cells) and each of the channels (fourth channels) of the memory cell transistors MT0*ob*1 to MT7*ob*1 (fourth memory cells) are boosted.

2-2-6. Example of Write Operation at Time T5

The write operation at the time T5 to T6 will be described with reference to FIG. 13. The write operation at the time T5 to T6 is an operation of writing a desired voltage to the selected memory cell transistor MT. As shown in FIG. 13, at the time T5 to T6, the voltage VPRG (fifth voltage) from the voltage VPASS (fourth voltage) is supplied to the selected even word line SEL-WLe_n (selected word line WLe3 (first word line)), and the memory cell transistor MT3*eb*2 and the memory cell transistor MT3*eb*1 enter an ON state. The voltage VPASS (fourth voltage) is supplied to the non-selected even word lines USEL-WLe other than the selected even word line SEL-WLe_n (word lines WLe4 to WLe7 and word lines WLe0 to WLe2), the non-selected odd word lines USEL-WLo_n, and the non-selected odd word lines USEL-WLo other than the non-selected odd word lines USEL-WLo_n (odd word lines WLo0 to WLo7). The voltage VCELSRC is supplied to the non-selected odd word lines USEL-WLo of the non-selected block USEL-BLK, and the voltage VCELSRC is supplied to the source line SL. The non-selected even word lines USEL-WLe of the non-selected block USEL-BLK store the voltage VCELSRC in a floating state.

In the first embodiment, the voltage VPRG (fifth voltage) is higher than the voltage VPASS (fourth voltage) and higher than the voltage VCHPCH (second voltage).

As described above, the voltage VPRG (fifth voltage) is supplied to the selected even word line SEL-WLe_n (selected word line WLe3 (first word line)), and a desired voltage from the voltage VSS is supplied to the bit line ProgramBL (bit line BL2), for example, in a state where the memory cell transistor MT3*eb*2 and the memory cell transistor MT3*eb*1 enter an ON state. The desired voltage is, for example, an "eR" state, an "A" state, a "B" state, a "C" state, a "D" state, an "E" state, an "F" state, or a "G" state. The voltage VPRG (fifth voltage) is a voltage significantly higher than the desired voltage. Therefore, the desired voltage is written to the memory cell transistor MT3*eb*2. In one embodiment, the voltage VPRG (fifth voltage) may also be referred to as a write voltage.

On the other hand, since the non-selected odd word lines USEL-WLo and the non-selected even word lines USEL-WLe, of the non-selected block USEL-BLK, are at the voltage VCELSRC, the word line switch WLSW of the non-selected block USEL-BLK is applied with the voltage VPGM on the drain side and the voltage VCELSRC on the source side. That is, it is possible to case the voltage VDS between the source and the drain of the word line switch WLSW to the potential difference (VDS=VPGM−VCELSRC) between the voltage VPGM and the voltage VCELSRC.

When a trench conductor structure using the conductor connected to the source line SL is provided in the slit SLT1, the voltage VCELSRC is applied to the source line SL, whereby the voltages of the non-selected even word lines USEL-WLe and the non-selected odd word lines USEL-WLo, of the non-selected block USEL-BLK, can be boosted through the capacitive coupling. In the semiconductor memory device 1 of the present disclosure, an insulating layer and a dummy pillar DP are provided in the slit SLT1. Since there is no trench conductor structure, the relationship of the capacitive coupling changes, and the voltages of the non-selected even word lines USEL-WLe and the non-selected odd word lines USEL-WLo, of the non-selected block USEL-BLK, change.

In the write operation of the semiconductor memory device 1 of the present disclosure, the non-selected even word lines USEL-WLe facing the non-selected odd word lines USEL-WLo can be boosted to the voltage VCELSRC by supplying the voltage VCELSRC to the non-selected odd word lines USEL-WLo of the non-selected block USEL-BLK. Since the non-selected odd word lines USEL-WLo and the non-selected even word lines USEL-WLe, of the non-selected block USEL-BLK, are at the voltage VCELSRC, it is possible to reduce the voltage VDS between the source and the drain of the word line switch WLSW, and to minimize the leakage current of the word line switch WLSW. By minimizing the leakage current of the word line switch WLSW, it is possible to minimize the voltage drop and the boost delay of the voltage VPGM, and as a result, the power consumption can be minimized.

In the write operation of the semiconductor memory device 1 according to the first embodiment, the operation up to the time T3 may be referred to as a "first operation", and the operation from the time T4 to the time T5 may be referred to as a "second operation".

2-3. Example of Verification Operation

Figure 16:
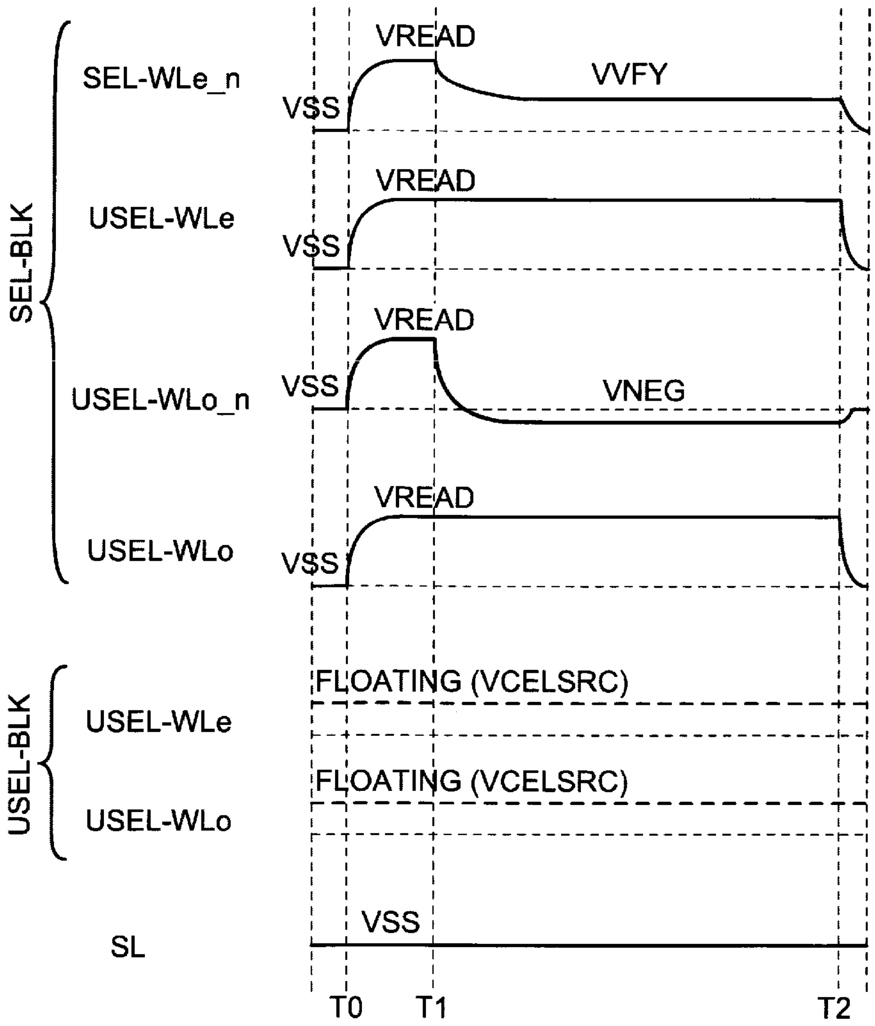
FIG. 16 is a diagram showing a timing chart of various signals during a verification operation of the semiconductor memory device according to the first embodiment.

An example of the verification operation of the semiconductor memory device 1 will be described with reference to FIG. 16. FIG. 16 is a diagram showing a timing chart of various signals during a verification operation of the semiconductor memory device 1 according to the first embodiment. In the description of the verification operation of the semiconductor memory device 1, the description of the same or similar configurations as those in FIGS. 1 to 15 may be omitted.

2-3-1. Example of Verification Operation up to Time T0

The verification operation up to the time T0 will be described with reference to FIG. 16. As shown in FIG. 16, up to time T0, the voltage VSS is supplied to the selected even word line SEL-WLe_n, the non-selected even word line USEL-WLe other than the selected even word line SEL-WLe_n, the non-selected odd word lines USEL-WLo_n facing the selected even word line SEL-WLe_n, the non-selected odd word lines USEL-WLo other than the non-selected odd word lines USEL-WLo_n, of the selected block SEL-BLK, and the source line SL. The non-selected even word lines USEL-WLe and the non-selected odd word lines USEL-WLo, of the non-selected block USEL-BLK store the voltage VCELSRC.

2-3-2. Example of Verification Operation up to Time T1

The verification operation at the time T0 to T1 will be described with reference to FIG. 16. The verification operation at the time T0 to T1 is, for example, an operation of supplying the voltage VREAD (sixth voltage) to the word line WL of the selected block SEL-BLK. In other words, the verification operation at the time T0 to T1 is an operation of supplying the voltage VREAD to the selected even word line SEL-WLe_n, the non-selected even word lines USEL-WLe other than the selected even word line SEL-WLe_n, the non-selected odd word lines USEL-WLo_n, and the non-selected odd word lines USEL-WLo other than the non-selected odd word lines USEL-WLo_n, of the selected block SEL-BLK. The non-selected even word lines USEL-WLe and the non-selected odd word lines USEL-WLo, of the non-selected block USEL-BLK, store the voltage VCELSRC. The voltage VSS is supplied to the source line SL.

2-3-3. Example Of Verification Operation up to Time T2

The verification operation at the time T1 to T2 will be described with reference to FIG. 16. The verification operation at the time T1 to T2 is, for example, an operation of supplying the voltage VVFY (sixth voltage) to the selected even word line SEL-WLe_n of the selected block SEL-BLK. The voltage VREAD is supplied to the non-selected even word lines USEL-WLe other than the selected even word line SEL-WLe_n and the non-selected odd word lines USEL-WLo other than the non-selected odd word lines USEL-WLo_n, of the selected block SEL-BLK. The voltage VNEG is supplied to the non-selected odd word lines USEL-WLo_n of the selected block SEL-BLK. The non-selected even word lines USEL-WLe and the non-selected odd word lines USEL-WLo, of the non-selected block USEL-BLK, store the voltage VCELSRC. The voltage VSS is supplied to the source line SL.

In the verification operation at the time T1 to T2, the selected memory cell transistor MT3*eb*2 to be verified enters an ON state or an OFF state according to the threshold voltage of the memory cell transistor MT3*eb*2 based on the voltage VVFY.

At the time T1 to T2, a plurality of different voltages are actually supplied in a step-by-step manner to the selected memory cell transistor MT3*eb*2 to be verified. At the time T1 to T2 shown in FIG. 16, an example is shown where the voltage supplied to the selected memory cell transistor MT3*eb*2 to be verified is the voltage VVFY (for example, the voltage V2 when the state is "2") according to one state (for example, the "2" state) at which the verification operation is executed.

In addition, at the time T1 to T2, an example is shown where the voltage VNEG is supplied to the non-selected odd word lines USEL-WLo_n of the selected block SEL-BLK. The voltage VNEG is a negative voltage lower than the voltage VSS. By applying the voltage VNEG, it is possible to forcibly put the non-selected odd word lines USEL-WLo_n of the selected block SEL-BLK into an OFF state.

As described above, the semiconductor memory device 1 executes the verification operation.

2-4. Example of Erasing Operation

Figure 17:
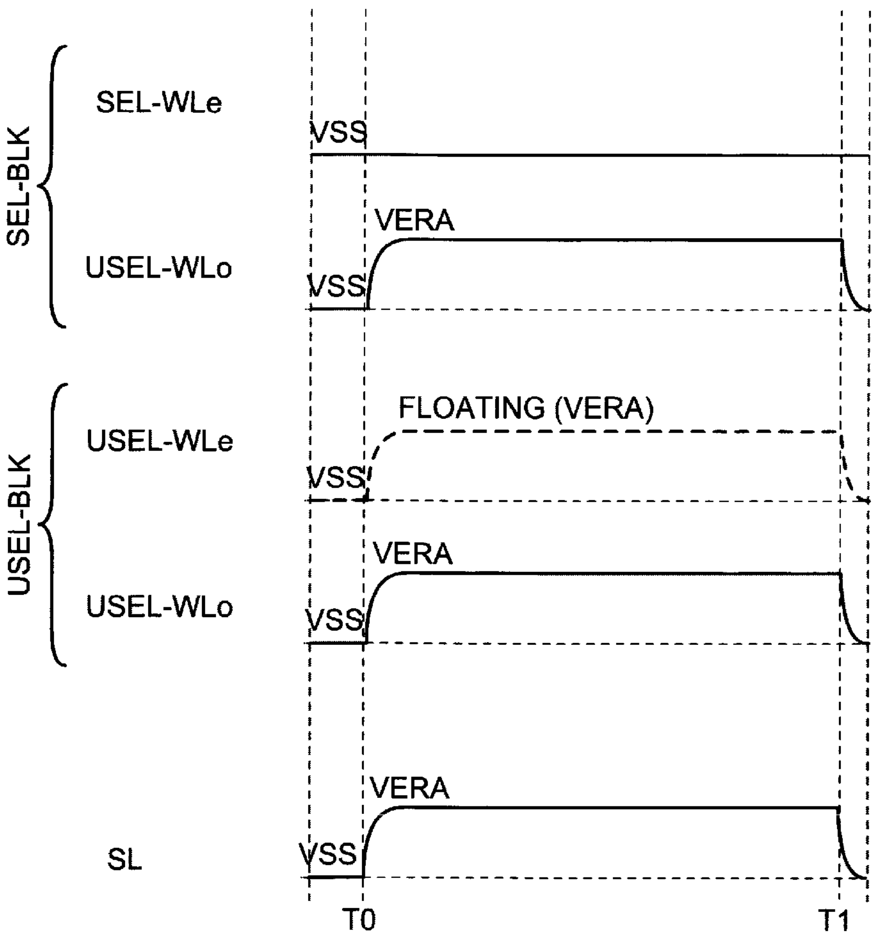
FIG. 17 is a diagram showing a timing chart of various signals during an erasing operation of the semiconductor memory device according to the first embodiment.

An example of the erasing operation of the semiconductor memory device 1 will be described with reference to FIG. 17. FIG. 17 is a diagram showing a timing chart of various signals during an erasing operation of the semiconductor memory device 1 according to the first embodiment. In the description of the erasing operation of the semiconductor memory device 1, the description of the same or similar configurations as those in FIGS. 1 to 16 may be omitted.

2-4-1. Example of Erasing Operation up to Time T0

The erasing operation up to the time T0 will be described with reference to FIG. 17. As shown in FIG. 17, up to the time T0, the voltage VSS is supplied to the selected even word line SEL-WLe and the non-selected odd word lines USEL-WLo, of the selected block SEL-BLK, the non-selected even word lines USEL-WLe and the non-selected odd word lines USEL-WLo, of the non-selected block USEL-BLK, and the source line SL.

2-4-2. Example of Erasing operation up to Time T1

The erasing operation at the time T0 to T1 will be described with reference to FIG. 17. The erasing operation at the time T0 to T1 is, for example, an operation of supplying the voltage VERA to the non-selected odd word lines USEL-WLo. In other words, in the erasing operation at the time T0 to T1, the voltage VERA is supplied to the non-selected odd word lines USEL-WLo of the selected block SEL-BLK, the non-selected odd word lines USEL-WLo of the non-selected block USEL-BLK, and the source line SL. The voltage VSS is supplied to the selected even word line SEL-WLe of the selected block SEL-BLK. As shown in FIG. 17, at the time T0 to T1 of the erasing operation according to the first embodiment, the non-selected even word lines USEL-WLe of the non-selected block USEL-BLK facing the non-selected odd word lines USEL-WLo to which the voltage VERA is supplied can be boosted to the voltage VERA through the capacitive coupling with the non-selected odd word lines USEL-WLo.

Figure 18:
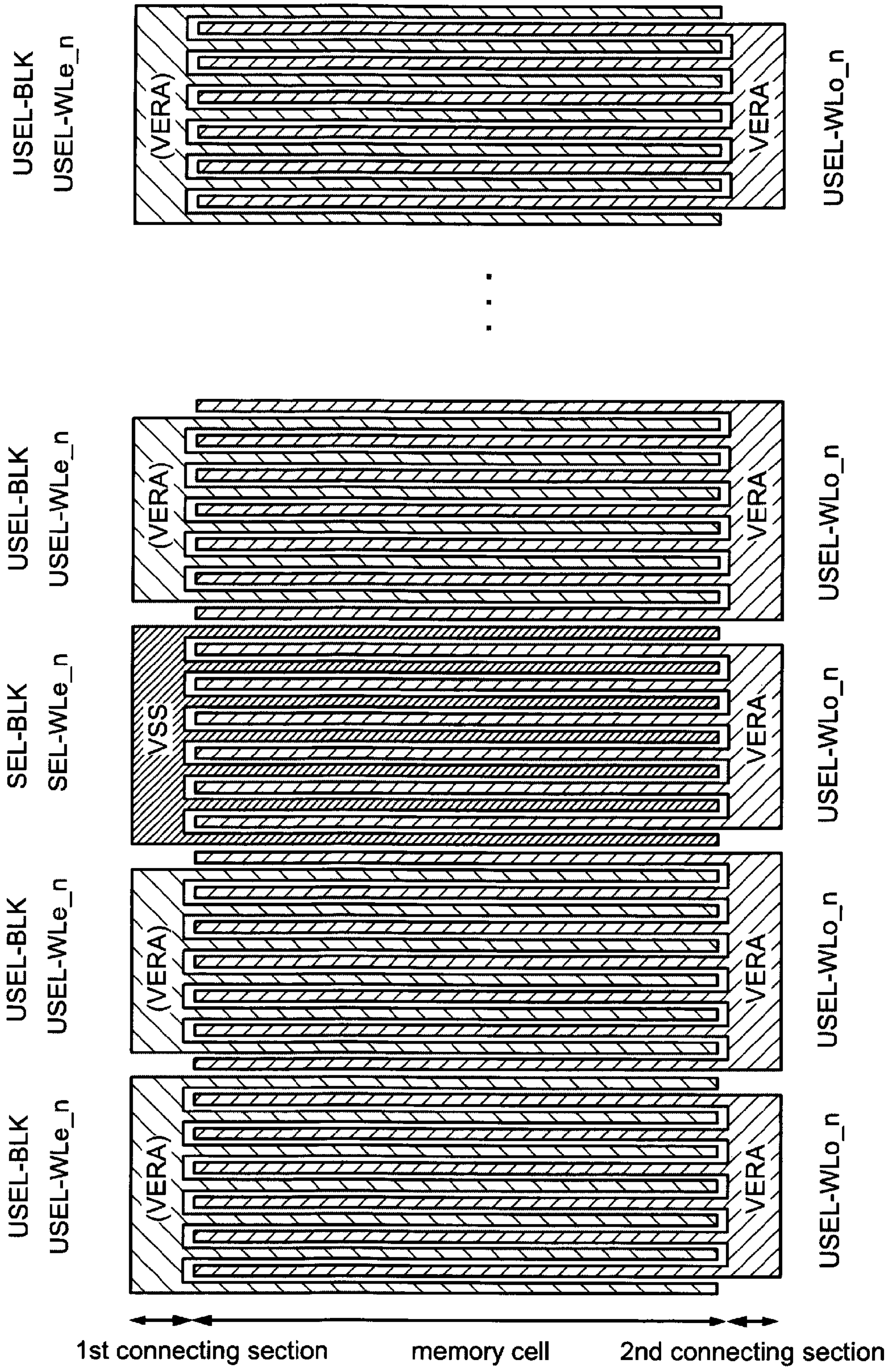
FIG. 18 is a diagram showing voltages supplied to various signal lines at time T0 of the timing chart shown in FIG. 17.

FIG. 18 is a diagram showing voltages supplied to various signal lines at time T0 of the timing chart shown in FIG. 17. The voltage VERA is supplied to the non-selected odd word lines USEL-WLo, and the voltage VSS is supplied to the selected even word line SEL-WLe of the selected block SEL-BLK. The non-selected even word lines USEL-WLe of the non-selected block USEL-BLK facing the non-selected odd word lines USEL-WLo can be boosted to the voltage VERA through the capacitive coupling with the non-selected odd word lines USEL-WLo. That is, by simultaneously supplying different voltages to the even word line WLe and the odd word line WLo, it is possible to achieve an efficient operation and to shorten the program time.

When each block is separated by a trench conductor structure achieved by providing a trench conductor structure using the conductor connected to the source line SL in the slit SLT1, in the erasing operation, the voltage VERA is applied to the source line SL, and the non-selected even word lines USEL-WLe and the non-selected odd word lines USEL-WLo, of the non-selected block USEL-BLK adjacent to the selected block SEL-BLK, are set to the floating state. In this case, by applying the voltage VERA to the source line SL, the voltages of the non-selected even word lines USEL-WLe and the non-selected odd word lines USEL-WLo, of the non-selected block USEL-BLK adjacent to the selected block SEL-BLK, can be boosted through capacitive coupling with the trench conductor structure, for example. On the other hand, in the semiconductor memory device 1 of the present disclosure, only an insulating layer and a dummy pillar DP are provided in the slit SLT1, and there is no trench conductor structure that separates each block. In the erasing operation in the semiconductor memory device 1 of the present disclosure, when the non-selected odd word lines USEL-WLo of the non-selected block USEL-BLK adjacent to the selected block SEL-BLK is simply set to the floating state, the non-selected odd word lines USEL-WLo of the non-selected block USEL-BLK is capacitively coupled to the selected even word line SEL-WLe of the selected block SEL-BLK, and the voltage of the non-selected odd word lines USEL-WLo of the non-selected block USEL-BLK becomes lower than the voltage VERA. In this case, there is a possibility that erroneous erasure may occur in the memory cell connected to the non-selected odd word lines USEL-WLo of the non-selected block USEL-BLK.

In the erasing operation of the semiconductor memory device 1 of the present disclosure, it is possible to minimize the influence of the voltage VSS of the selected even word line SEL-WLe of the selected block SEL-BLK by supplying the voltage VERA to the non-selected odd word lines USEL-WLo of the non-selected block USEL-BLK. In addition, by boosting the voltage of the non-selected even word lines USEL-WLe facing the non-selected odd word lines USEL-WLo of the non-selected block USEL-BLK through the capacitive coupling to the voltage VERA, it is possible to minimize the influence of the voltage VSS of the selected even word line SEL-WLe of the selected block SEL-BLK near the first connecting section. That is, by setting the non-selected odd word lines USEL-WLo and the non-selected even word lines USEL-WLe, of the non-selected block USEL-BLK, at the voltage VERA, the potential difference with the voltage VERA of the source line is eliminated, and it is possible to minimize the erroneous erasure of the non-selected block USEL-BLK, and as a result, the reliability can be improved.

2-5. First Modification Example of Erasing Operation (Modification Example 1)

Modification Example 1 of the erasing operation in the semiconductor memory device 1 according to the first embodiment will be described. In the erasing operation according to the first embodiment, an example of the erasing operation of the even word line WLe of the selected block SEL-BLK was described. In the erasing operation according to Modification Example 1, an example of the erasing operation of the odd word line WLo of the selected block SEL-BLK will be described. In the description of Modification Example 1 of the erasing operation, the points different from the example of the erasing operation of the semiconductor memory device 1 according to the first embodiment are described, and duplicate descriptions are added as necessary.

Figure 19:
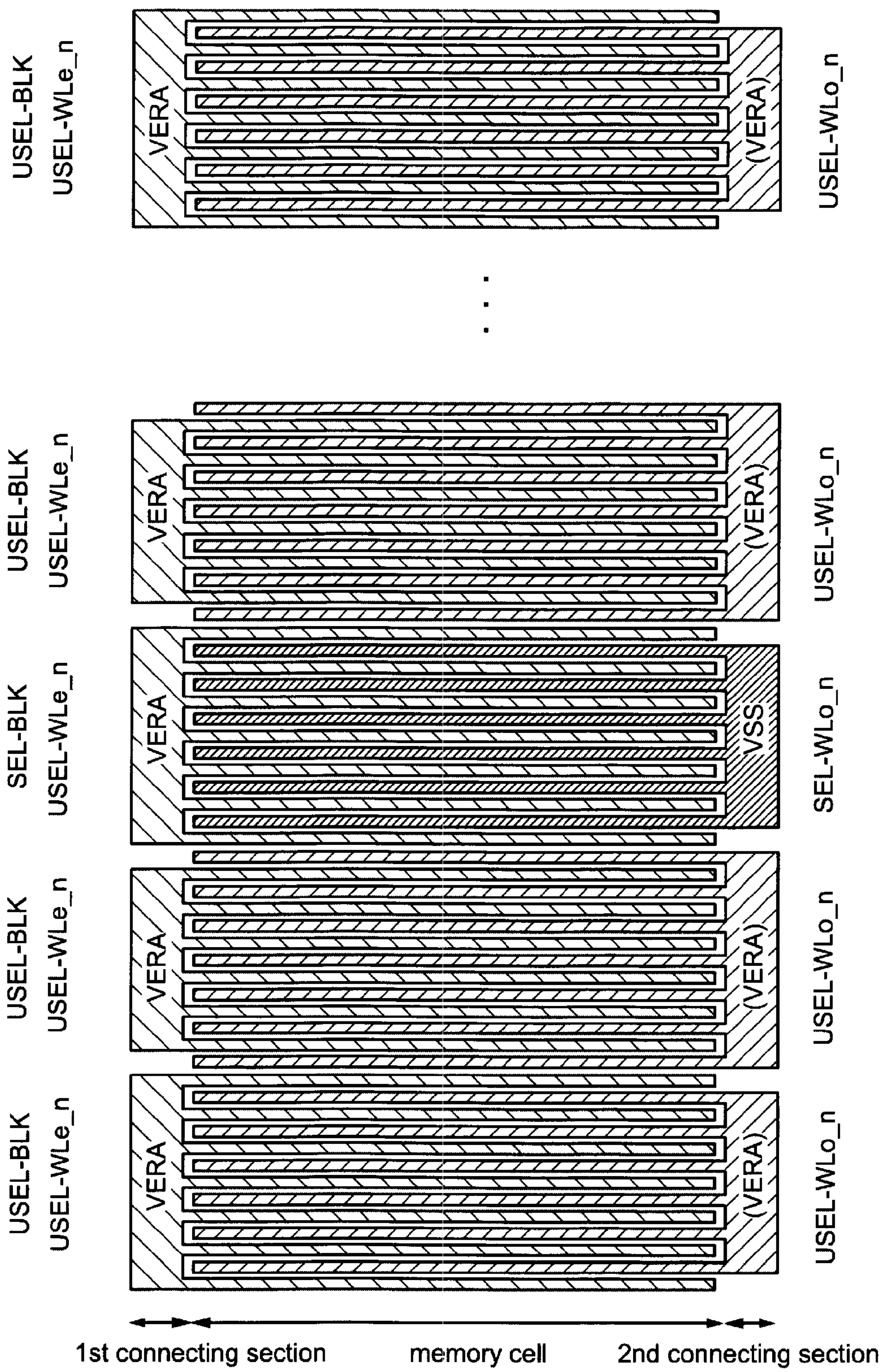
FIG. 19 is a diagram showing voltages supplied to various signal lines at time T0 of Modification Example 1.

FIG. 19 is a diagram showing the voltages supplied to various signal lines at the time T0 of the erasing operation according to Modification Example 1. In Modification Example 1, the voltage VERA is supplied to the non-selected even word lines USEL-WLe, and the voltage VSS is supplied to the selected odd word line SEL-WLo_n of the selected block SEL-BLK. The non-selected odd word lines USEL-WLo of the non-selected block USEL-BLK facing the non-selected even word lines USEL-WLe can be boosted to the voltage VERA through the capacitive coupling with the non-selected even word lines USEL-WLe. That is, by simultaneously supplying different voltages to the even word line WLe and the odd word line WLo, it is possible to achieve an efficient operation and to shorten the program time.

In the erasing operation of the semiconductor memory device 1 of Modification Example 1, by supplying the voltage VERA to the non-selected even word lines USEL-WLe of the selected block SEL-BLK, it is possible to minimize the influence of the voltage VSS of the selected odd word line SEL-WLo of the selected block SEL-BLK. In addition, by boosting the voltage of the non-selected odd word lines USEL-WLo facing the non-selected even word lines USEL-WLe of the non-selected block USEL-BLK to the voltage VERA through the capacitive coupling, it is possible to minimize the influence of the voltage VSS of the selected odd word line SEL-WLo of the selected block SEL-BLK near the second connecting section. That is, by setting the non-selected even word lines USEL-WLe of the selected block SEL-BLK and the non-selected even word lines USEL-WLe of the non-selected block USEL-BLK at the voltage VERA, the potential difference with the voltage VERA of the source line is eliminated, and it is possible to minimize the erroneous erasure of the non-selected block USEL-BLK, and as a result, the reliability can be improved.

2-6. Second Modification Example of Erasing Operation (Modification Example 2)

Modification Example 2 of the erasing operation in the semiconductor memory device 1 according to the first embodiment will be described. In the erasing operation according to the first embodiment, an example of the erasing operation of supplying the voltage VERA to all the odd word lines WLo was described. In the erasing operation according to Modification Example 2, an example of the erasing operation of supplying the voltage VERA to the odd word lines WLo of the selected block SEL-BLK and the non-selected block USEL-BLK adjacent to the selected block SEL-BLK will be described. In the description of Modification Example 2 of the erasing operation, the points different from the example of the erasing operation of the semiconductor memory device 1 according to the first embodiment are described, and duplicate descriptions are added as necessary.

Figure 20:
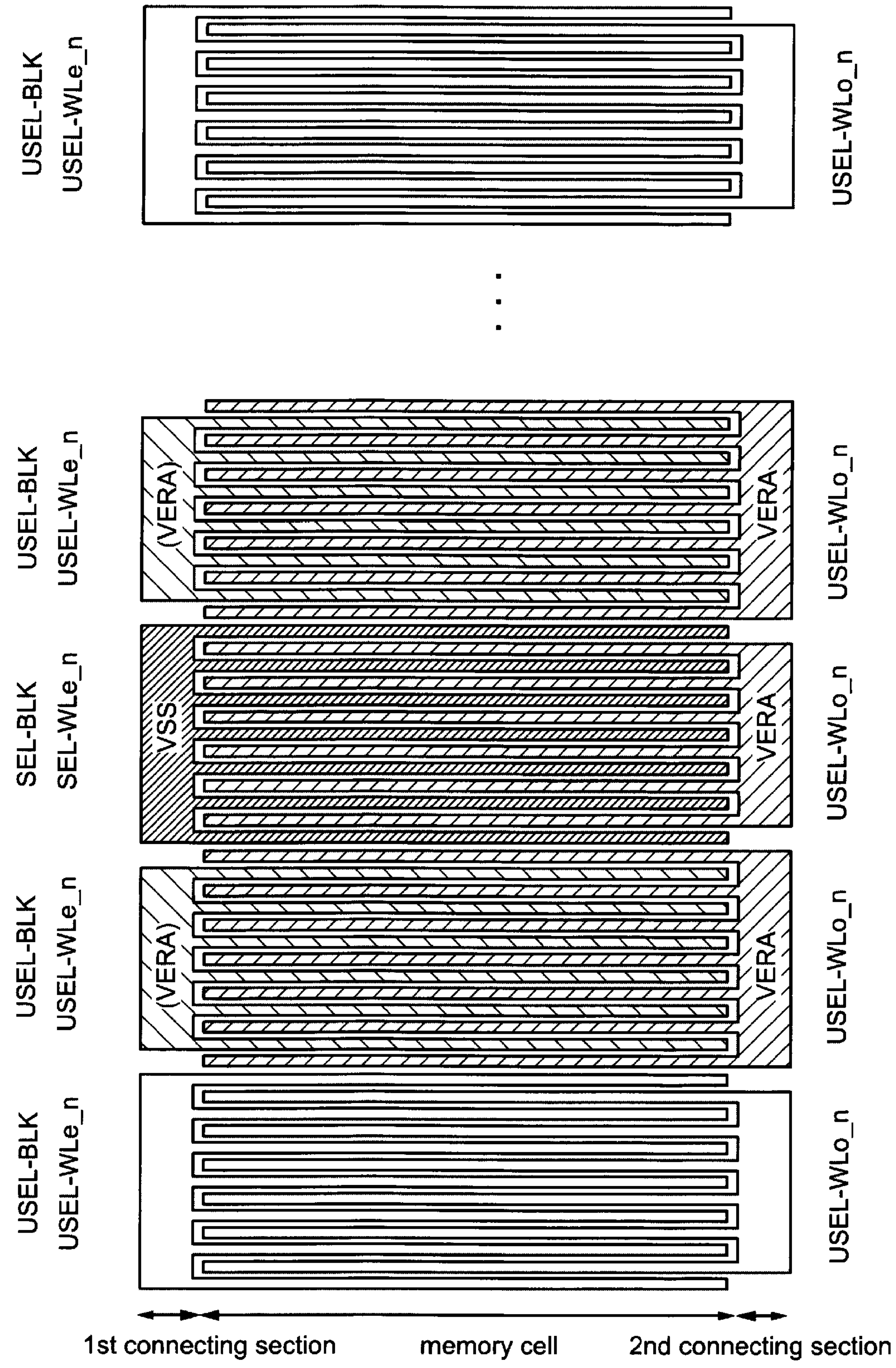
FIG. 20 is a diagram showing voltages supplied to various signal lines at time T0 of Modification Example 2.

FIG. 20 is a diagram showing the voltages supplied to various signal lines at the time T0 of the erasing operation according to Modification Example 2. In Modification Example 2, the voltage VERA is supplied to the non-selected odd word lines USEL-WLo of the selected block SEL-BLK and the non-selected odd word lines USEL-WLo of the non-selected blocks USEL-BLK adjacent to the selected block SEL-BLK, and the voltage VSS is supplied to the selected even word line SEL-WLe_n of the selected block SEL-BLK. The non-selected even word lines USEL-WLe of the non-selected blocks USEL-BLK adjacent to the selected block SEL-BLK facing the non-selected odd word lines USEL-WLo to which the voltage VERA is supplied can be boosted to the voltage VERA through the capacitive coupling with the non-selected odd word lines USEL-WLo. That is, by simultaneously supplying different voltages to the even word line WLe and the odd word line WLo, it is possible to achieve an efficient operation and to shorten the program time.

In the erasing operation of the semiconductor memory device 1 in Modification Example 2, by supplying the voltage VERA to the non-selected odd word line USEL-WLo of the non-selected block USEL-BLK adjacent to the selected block SEL-BLK, it is possible to minimize the influence of the voltage VSS of the selected even word line SEL-WLe of the selected block SEL-BLK. In addition, by boosting the voltage of the non-selected even word lines USEL-WLe facing the non-selected odd word lines USEL-WLo of the non-selected block USEL-BLK adjacent to the selected block SEL-BLK to the voltage VERA through the capacitive coupling, it is possible to minimize the influence of the voltage VSS of the selected even word line SEL-WLe of the selected block SEL-BLK near the first connecting section. That is, by setting the non-selected odd word lines USEL-WLo of the selected block SEL-BLK and the non-selected odd word lines USEL-WLo of the non-selected blocks USEL-BLK adjacent to the selected block SEL-BLK at the voltage VERA, the potential difference with the voltage VERA of the source line is eliminated, and it is possible to minimize the erroneous erasure of the non-selected block USEL-BLK, and as a result, the reliability can be improved.

2-7. Third Modification Example of Erasing Operation (Modification Example 3)

Modification Example 3 of the erasing operation in the semiconductor memory device 1 according to the first embodiment will be described. In the erasing operation according to the first embodiment, an example of the erasing operation of supplying the voltage VERA to all the odd word lines WLo was described. In the erasing operation according to Modification Example 3, an example of the erasing operation of supplying the voltage VERA to the non-selected blocks USEL-BLK adjacent to the selected block SEL-BLK will be described. In the description of Modification Example 3 of the erasing operation, the points different from the example of the erasing operation of the semiconductor memory device 1 according to the first embodiment are described, and duplicate descriptions are added as necessary.

Figure 21:
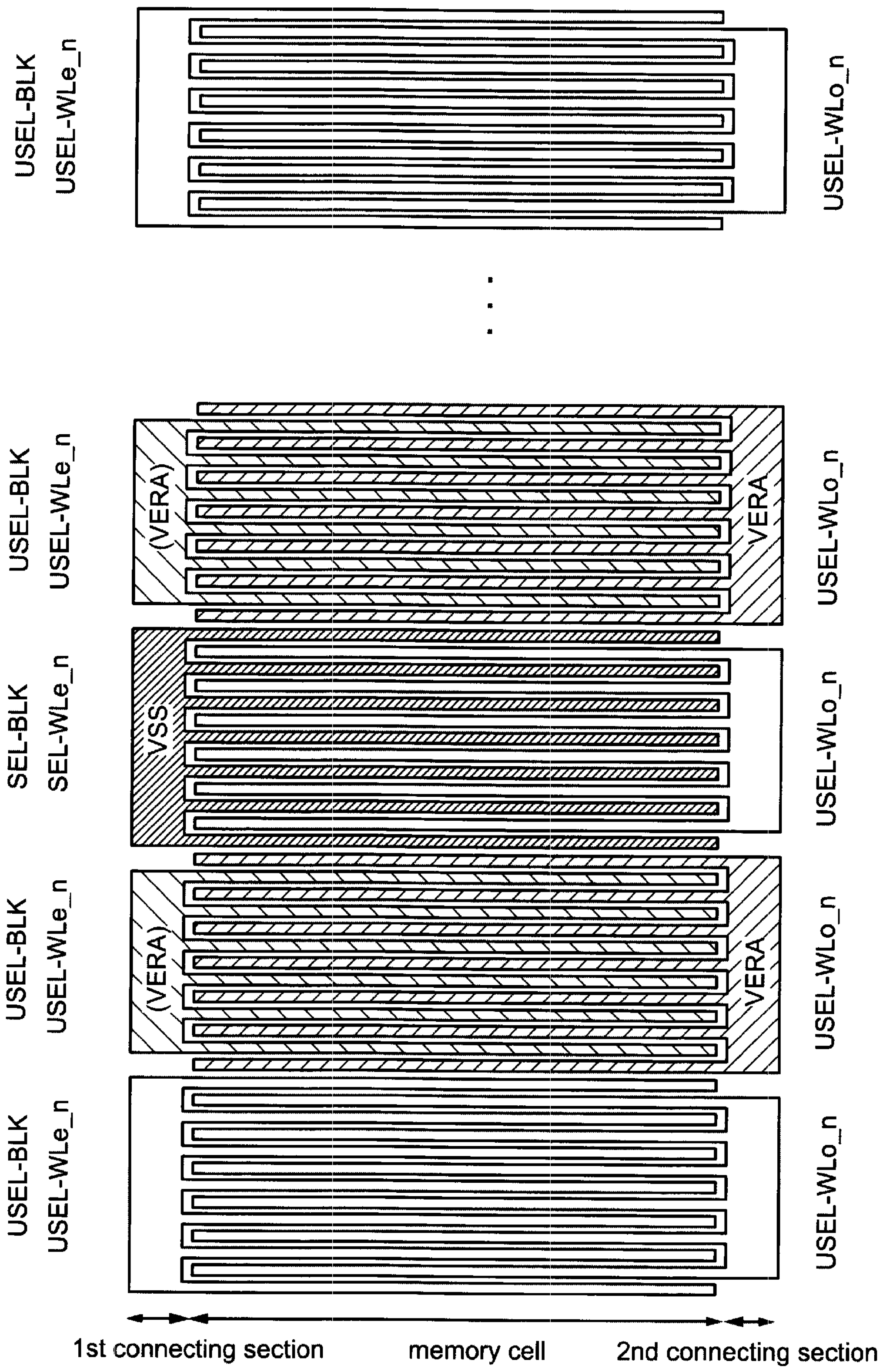
FIG. 21 is a diagram showing voltages supplied to various signal lines at time T0 of Modification Example 3.

FIG. 21 is a diagram showing the voltages supplied to various signal lines at the time T0 of the erasing operation according to Modification Example 3. In Modification Example 3, the voltage VERA is supplied to the non-selected odd word lines USEL-WLo of the non-selected blocks USEL-BLK adjacent to the selected block SEL-BLK, and the voltage VSS is supplied to the selected even word line SEL-WLe_n of the selected block SEL-BLK. The non-selected even word lines USEL-WLe of the non-selected blocks USEL-BLK adjacent to the selected block SEL-BLK facing the non-selected odd word lines USEL-WLo to which the voltage VERA is supplied can be boosted to the voltage VERA through the capacitive coupling with the non-selected odd word lines USEL-WLo. That is, by simultaneously supplying different voltages to the even word line WLe and the odd word line WLo, it is possible to achieve an efficient operation and to shorten the program time.

In the erasing operation of the semiconductor memory device 1 in Modification Example 3, by supplying the voltage VERA to the non-selected odd word lines USEL-WLo of the non-selected block USEL-BLK adjacent to the selected block SEL-BLK, it is possible to minimize the influence of the voltage VSS of the selected even word line SEL-WLe of the selected block SEL-BLK. In addition, by boosting the voltage of the non-selected even word lines USEL-WLe facing the non-selected odd word lines USEL-WLo of the non-selected block USEL-BLK adjacent to the selected block SEL-BLK to the voltage VERA through the capacitive coupling, it is possible to minimize the influence of the voltage VSS of the selected even word line SEL-WLe of the selected block SEL-BLK near the first connecting section. That is, by setting the non-selected odd word lines USEL-WLo of the non-selected blocks USEL-BLK adjacent to the selected block SEL-BLK at the voltage VERA, the potential difference with the voltage VERA of the source line is eliminated, and it is possible to minimize the erroneous erasure of the non-selected block USEL-BLK, and as a result, the reliability can be improved. Even if the non-selected odd word lines USEL-WLo of the selected block SEL-BLK are affected by the voltage VSS of the selected even word line SEL-WLe of the selected block SEL-BLK, there is no particular issue as long as the subsequent erasing operation of the non-selected odd word lines USEL-WLo of the selected block SEL-BLK is performed.

Other Embodiments

Each of the configurations described as a configuration provided in the semiconductor memory device in the first embodiment and the modification examples may be realized using either hardware or software, or may be realized using a combination of hardware and software.

In the first embodiment and the modification examples, when using terms like "the same", "substantially the same", or "identical", the terms of "the same", "substantially the same", or "identical" may include margin of error within the scope of design tolerances.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:

a first semiconductor pillar extending in a first direction;

a second semiconductor pillar extending in the first direction;

a first string provided on a first side of the first semiconductor pillar, and including a plurality of first memory cells electrically connected in series;

a second string provided on a second side of the first semiconductor pillar, and including a plurality of second memory cells electrically connected in series;

a third string provided on a first side of the second semiconductor pillar, and including a plurality of third memory cells electrically connected in series;

a fourth string provided on a second side of the second semiconductor pillar, and including a plurality of fourth memory cells electrically connected in series;

a third semiconductor pillar extending in the first direction;

a fourth semiconductor pillar extending in the first direction;

a fifth string provided on a first side of the third semiconductor pillar, and including a plurality of fifth memory cells electrically connected in series;

a sixth string provided on a second side of the third semiconductor pillar, and including a plurality of sixth memory cells electrically connected in series;

a seventh string provided on a first side of the fourth semiconductor pillar, and including a plurality of seventh memory cells electrically connected in series;

an eighth string provided on a second side of the fourth semiconductor pillar, and including a plurality of eighth memory cells electrically connected in series;

a plurality of first word lines stacked in the first direction, each of the first word lines electrically connected in common to one of the plurality of first memory cells and one of the plurality of third memory cells;

a plurality of second word lines stacked in the first direction, each of the second word lines electrically connected in common to one of the plurality of second memory cells and one of the plurality of fourth memory cells;

a plurality of third word lines stacked in the first direction, each of the third word lines electrically connected in common to one of the plurality of fifth memory cells and one of the plurality of seventh memory cells;

a plurality of fourth word lines stacked in the first direction, each of the fourth word lines electrically connected in common to one of the plurality of sixth memory cells and one of the plurality of eighth memory cells;

a plurality of dummy pillars extending in the first direction and disposed in a boundary region that is between the second and third word lines in a second direction orthogonal to the first direction and that extends in the first direction and a third direction orthogonal to the first and second directions; and a driver configured to supply different voltages to the first and second word lines during an erasing operation to erase data in the plurality of second memory cells and the plurality of fourth memory cells, wherein the first, second, third, and fourth semiconductor pillars are aligned in the second direction, and in the erasing operation, the driver supplies a first voltage higher than a reference voltage to the plurality of first word lines, supplies the reference voltage to the plurality of second word lines, and supplies the first voltage to the plurality of third word lines.

2. The semiconductor memory device according to claim 1, wherein in the erasing operation, the driver disconnects the plurality of fourth word lines from a voltage supply so that the fourth word lines are maintained in a floating state.

3. The semiconductor memory device according to claim 2, wherein a voltage of the fourth word lines increases to the first voltage during the erasing operation.

4. The semiconductor memory device according to claim 1, further comprising an insulating film disposed in the boundary region where the dummy pillars are not disposed.

5. The semiconductor memory device according to claim 1, wherein the first and second word lines each have finger portions that extend in the third direction, and the first semiconductor pillar is disposed in a first boundary region that is between one of the finger portions of the first word lines and one of the finger portions of the second word lines, and the second semiconductor pillar is disposed in a second boundary region that is between another one of the finger portions of the first word lines and another one of the finger portions of the second word lines.

6. A semiconductor memory device comprising:

a first semiconductor pillar extending in a first direction;

a second semiconductor pillar extending in the first direction;

a first string provided on a first side of the first semiconductor pillar, and including a plurality of first memory cells electrically connected in series;

a second string provided on a second side of the first semiconductor pillar, and including a plurality of second memory cells electrically connected in series;

a third string provided on a first side of the second semiconductor pillar, and including a plurality of third memory cells electrically connected in series;

a fourth string provided on a second side of the second semiconductor pillar, and including a plurality of fourth memory cells electrically connected in series;

a third semiconductor pillar extending in the first direction;

a fourth semiconductor pillar extending in the first direction;

a fifth string provided on a first side of the third semiconductor pillar, and including a plurality of fifth memory cells electrically connected in series;

a sixth string provided on a second side of the third semiconductor pillar, and including a plurality of sixth memory cells electrically connected in series;

a seventh string provided on a first side of the fourth semiconductor pillar, and including a plurality of seventh memory cells electrically connected in series;

an eighth string provided on a second side of the fourth semiconductor pillar, and including a plurality of eighth memory cells electrically connected in series;

a plurality of first word lines stacked in the first direction, each of the first word lines electrically connected in common to one of the plurality of first memory cells and one of the plurality of third memory cells;

a plurality of second word lines stacked in the first direction, each of the second word lines electrically connected in common to one of the plurality of second memory cells and one of the plurality of fourth memory cells;

a plurality of third word lines stacked in the first direction, each of the third word lines electrically connected in common to one of the plurality of fifth memory cells and one of the plurality of seventh memory cells;

a plurality of fourth word lines stacked in the first direction, each of the fourth word lines electrically connected in common to one of the plurality of sixth memory cells and one of the plurality of eighth memory cells;

first and second bit lines extending in a second direction above the first, second, third, and fourth semiconductor pillars; and a driver configured to supply different voltages to the first and second word lines during an erasing operation to erase data in the plurality of second memory cells and the plurality of fourth memory cells, wherein the first bit line is electrically connected to the second and third semiconductor pillars and the second bit line is electrically connected to the first and fourth semiconductor pillars, and the first, second, third, and fourth semiconductor pillars are aligned in the second direction, and in the erasing operation, the driver supplies a first voltage higher than a reference voltage to the plurality of first word lines, supplies the reference voltage to the plurality of second word lines, and supplies the first voltage to the plurality of third word lines.

7. The semiconductor memory device according to claim 6, further comprising:

a fifth semiconductor pillar aligned with the first, second, third, and fourth semiconductor pillars in the second direction and electrically connected to the second bit line;

a sixth semiconductor pillar aligned with the first, second, third, and fourth semiconductor pillars in the second direction and electrically connected to the first bit line;

a ninth string provided on a first side of the fifth semiconductor pillar, and including a plurality of ninth memory cells electrically connected in series;

a tenth string provided on a second side of the fifth semiconductor pillar, and including a plurality of tenth memory cells electrically connected in series;

an eleventh string provided on a first side of the sixth semiconductor pillar, and including a plurality of eleventh memory cells electrically connected in series;

a twelfth string provided on a second side of the sixth semiconductor pillar, and including a plurality of twelfth memory cells electrically connected in series;

a plurality of fifth word lines, each of the fifth word lines electrically connected in common to one of the plurality of ninth memory cells and one of the plurality of eleventh memory cells; and a plurality of sixth word lines, each of the sixth word lines electrically connected in common to one of the plurality of tenth memory cells and one of the plurality of twelfth memory cells, wherein in the erasing operation, the driver supplies the first voltage to the plurality of fifth word lines.

8. The semiconductor memory device according to claim 7, further comprising:

a plurality of first dummy pillars extending in the first direction and disposed in a first boundary region that is between the second and third word lines in the second direction and extends in the first direction and a third direction that is orthogonal to the first and second directions;

a first insulating film disposed in the first boundary region where the first dummy pillars are not disposed;

a plurality of second dummy pillars extending in the first direction disposed in a second boundary region that is between the second and fifth word lines in the second direction and extends in the first direction and the third direction; and a second insulating film disposed in the second boundary region where the second dummy pillars are not disposed.

9. The semiconductor memory device according to claim 8, wherein one of the first dummy pillars is aligned with the second and third semiconductor pillars in the second direction and is between the second and third semiconductor pillars, and none of the second dummy pillars is aligned with the fifth and sixth semiconductor pillars in the second direction.

* * * * *